United States Patent
Maeda et al.

(10) Patent No.: US 6,900,144 B2
(45) Date of Patent: May 31, 2005

(54) FILM-FORMING SURFACE REFORMING METHOD AND SEMICONDUCTOR DEVICE MANUFACTURING METHOD

(75) Inventors: Kazuo Maeda, Tokyo (JP); Setsu Suzuki, Tokyo (JP); Takayoshi Azumi, Tokyo (JP); Kiyotaka Sasaki, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 70 days.

(21) Appl. No.: 09/808,016

(22) Filed: Mar. 15, 2001

(65) Prior Publication Data

US 2001/0029109 A1 Oct. 11, 2001

(30) Foreign Application Priority Data

Mar. 31, 2000 (JP) ........................................ 2000-098262
Jan. 9, 2001 (JP) ........................................ 2001-001759

(51) Int. Cl.[7] .............................................. H01L 21/31
(52) U.S. Cl. ...................... 438/778; 438/758; 438/761; 438/762; 438/770; 438/773; 438/787; 438/791
(58) Field of Search ................................. 438/758, 761, 438/762, 770, 773, 778, 787, 791

(56) References Cited

U.S. PATENT DOCUMENTS

| | | | |
|---|---|---|---|
| 5,424,253 A | 6/1995 | Usami et al. | 437/238 |
| 5,470,800 A | 11/1995 | Muroyama | 427/539 |
| 5,605,867 A | 2/1997 | Sato et al. | 437/235 |
| 5,656,337 A | 8/1997 | Park et al. | 437/238 |

FOREIGN PATENT DOCUMENTS

| | | | | |
|---|---|---|---|---|
| EP | 0 421 075 A1 | 7/1990 | | |
| EP | 1 058 301 A1 | * 9/1994 | ......... | H01L/21/316 |
| EP | 0 947 604 A1 | 5/1998 | | |
| EP | 1 058 301 A1 | 2/1999 | | |
| GB | 1342637 | 10/1997 | | |
| JP | 05-198369 | 10/1993 | | |
| JP | 5-259297 | 10/1993 | | |
| JP | 5-343394 | * 12/1993 | ......... | H01L/21/316 |
| JP | 6-181205 | 6/1994 | | |
| JP | 6-283508 | 8/1994 | | |
| JP | 6-267939 | 9/1994 | | |
| JP | 7-29901 | 1/1995 | | |
| JP | 7-50295 | 2/1995 | | |
| JP | 7-58100 | 3/1995 | | |
| JP | 7-99191 | 4/1995 | | |
| JP | 7-122552 | 5/1995 | | |
| JP | 9-129632 | 5/1997 | | |
| JP | 9-148324 | 6/1997 | | |
| JP | 9-205089 | 8/1997 | | |
| JP | 11-74485 | 3/1999 | | |
| JP | 11-111714 | 4/1999 | | |
| JP | 11-288933 | 10/1999 | | |
| JP | 2001-176868 | 6/2001 | | |
| KR | 1995-7032 | 3/1995 | | |

OTHER PUBLICATIONS

Ghandi, VLSI Fabrication Principles, 2nd Ed.,© 1994, pp. 640–641.*
Chemical search report: www.chemfinder.com (3pages).*
Silicon Processing for the VLSI Era, vol. 2—Process Integration. By Stanley. Wolf PhD. pp. 196–199.

* cited by examiner

*Primary Examiner*—Kamand Cuneo
*Assistant Examiner*—Lisa Kilday
(74) *Attorney, Agent, or Firm*—Lorusso, Loud & Kelly

(57) ABSTRACT

A film-forming surface reforming method includes the steps of bringing a gas or an aqueous solution containing ammonia, hydrazine, an amine, an amino compound or a derivative thereof into contact with the film-forming surface before an insulating film is formed on the film-forming surface, and bringing a gas or an aqueous solution containing Hydrogen peroxide, ozone, Oxygen, nitric acid, sulfuric acid or a derivative thereof into contact with the film-forming surface.

14 Claims, 17 Drawing Sheets growth temperature : 450°C
$O_3$ concentration : 160g/m$^3$
growth rate : 60nm/min FIG.16    (PRIOR ART)
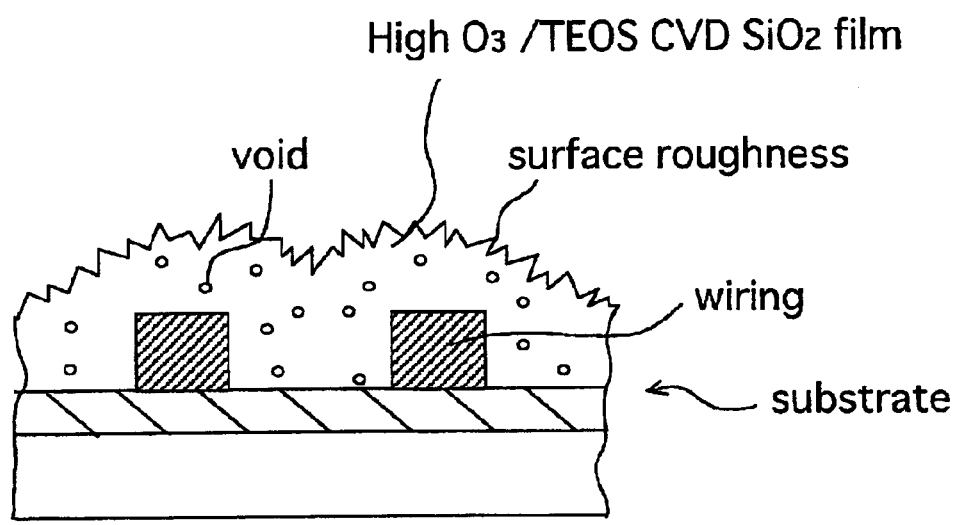

FILM-FORMING SURFACE REFORMING METHOD AND SEMICONDUCTOR DEVICE MANUFACTURING METHOD

BACKGROUND OF THE INVENTION

1. Field of the Invention

The present invention relates to a semiconductor device manufacturing method and, more particularly, to a method for reforming a surface to reduce surface dependency in film formation by a thermal chemical vapor deposition method (thermal CVD method) using a reaction gas (referred to as an "$O_3$/TEOS reaction gas" hereinafter) containing TEOS (tetraethylorthosilicate) and an ozone-containing gas including ozone ($O_3$) in Oxygen ($O_2$) and, in a semiconductor device manufacturing method employing this reforming method. "Surface dependency" means that formation of the CVD film grown on the film-forming surface is affected in growth rate, etc., by the chemical properties of the surface on which it is formed.

2. Description of the Prior Art

In recent years, with the progress of super high density and multi-layered wiring in semiconductor devices, the development of technology for forming an insulating film demands superiority in surface planarity, recess filling, step coverage, and suppression of permeation of moisture and impurities. The film forming technology developed to satisfy these demands includes a method of forming the film by CVD using a $O_3$/TEOS reaction gas. In this case, an excellent film can be obtained if the $O_3$ concentration is set higher.

The influence of such surface dependency does not appear with a low $O_3$ concentration, but is evident under conditions of high $O_3$ concentration.

In the following description, the $O_3$/TEOS reaction gas having a high $O_3$ concentration is called a "high $O_3$/TEOS reaction gas", and a Silicon dioxide film formed by the CVD method using this reaction gas is called "high $O_3$/TEOS $SiO_2$ film". Also, the $O_3$/TEOS reaction gas having a low $O_3$ concentration is called "low $O_3$/TEOS reaction gas", and a Silicon dioxide film formed by the CVD method using this reaction gas is called a "low $O_3$/TEOS $SiO_2$ film". In general, the Silicon dioxide film formed by the CVD method using the $O_3$/TEOS reaction gas containing various $O_3$ concentrations is called simply an "$O_3$/TEOS $SiO_2$ film".

FIG. 16 is a sectional view showing the state in which the film has grown abnormally due to the influence of surface dependency.

In the prior art, in order to eliminate surface dependency, the methods shown in FIGS. 17A to 17D are employed. These methods are:

(i) irradiating a plasma onto the film-forming surface (FIG. 17A), (ii) covering the film deposition surface with a plasma CVD $SiO_2$ film (FIG. 17B), (iii) forming a low $O_3$/TEOS CVD $SiO_2$ film as an underlying layer prior to film formation of the high $O_3$/TEOS CVD $SiO_2$ film (FIG. 17C), and (iv) forming a thin low $O_3$/TEOS CVD $SiO_2$ film, irradiating the surface of the film with a plasma, and forming the high $O_3$/TEOS CVD $SiO_2$ film on the low $O_3$TEOS CVD $SiO_2$ film (FIG. 17D). In the above methods (iii) and (iv), double layers consisting of the low $O_3$/TEOS CVD $SiO_2$ film and the high $O_3$/TEOS CVD $SiO_2$ film are employed.

However, the conventional methods have the following respective problems.

(i) With the method of irradiating a plasma onto the film deposition surface, conditions suppressing the surface dependency are varied. Therefore, since the conditions can neither be standardized nor shared for all film deposition surfaces, the conditions must be optimized for each film deposition surface.

In addition, separate plasma CVD equipment must be provided to generate the plasma.

(ii) In the method covering the film deposition surface with a plasma CVD $SiO_2$ film, some process conditions provide a film that is compatible with a high $O_3$/TEOS CVD $SiO_2$ film that exhibits good film properties. However, since the plasma CVD $SiO_2$ film has poor step coverage, the plasma CVD $SiO_2$ film is not suitable for fine patterns. Also, plasma CVD equipment must be separately provided.

(iii) Covering the film deposition surface with the low $O_3$/TEOS CVD $SiO_2$ film, since the low $O_3$/TEOS CVD $SiO_2$ film has very good affinity to the high $O_3$/TEOS CVD $SiO_2$ film, eliminates the surface dependency. However, the low $O_3$/TEOS CVD $SiO_2$ film shows isotropic growth characteristics, and a film thickness of at least 100 nm is needed to enable use of the film as an underlying film that eliminates surface dependency.

Therefore, such low $O_3$/TEOS CVD $SiO_2$ film is unsuitable for fine patterns.

Though the method of eliminating the surface dependency by using the low $O_3$/TEOS CVD $SiO_2$ film that was formed under low pressure was examined, this film was essentially the same as the low $O_3$/TEOS CVD $SiO_2$ film, and therefore was unsuitable for fine patterning for the same reason.

(iv) Covering the film deposition surface with a low $O_3$/TEOS CVD $SiO_2$ film and then irradiating the film with a plasma makes the method complicated.

Thus, the conventional methods are generally not suitable for filling a narrow and deep recess, while recent demand for high density in semiconductor devices requires a method for forming an interlayer or cover insulating film that has superior film properties, and especially a method that can fill a narrow and deep recess.

SUMMARY OF THE INVENTION

It is an object of the present invention to provide a film deposition surface reforming method capable of almost completely eliminating the surface dependency of the surface by an extremely simple approach without using additional energy such as plasma irradiation or high temperature heating, and without a vacuum, etc.

Another object of the present invention is to provide a semiconductor device manufacturing method employing this reforming method.

In the surface reforming method of the present invention, a gas or an aqueous solution containing an alkaline substance selected from the group consisting of ammonia, hydrazine, amines, amino compounds, and their derivatives is brought into contact with the surface, and then a gas or an aqueous solution containing an oxidizing agent selected from the group consisting of Hydrogen peroxide, ozone, Oxygen nitric acid, sulfuric acid, and their derivatives is brought into contact with the surface.

The gas or the aqueous solution containing any alkali selected from the group consisting of ammonia, hydrazine, amines, amino compounds, and their derivatives can etch the Silicon oxide film and the Silicon nitride film exposed on the film-forming surface. The surface of the Silicon oxide film or the Silicon nitride film that is etched in this manner is brought into a chemically active state, and hence the surface is easily oxidized by bringing the gas or the aqueous solution containing Hydrogen peroxide, ozone, Oxygen, nitric acid, sulfuric acid or a derivative into contact with the activated surface, whereby a thin oxide film can be formed.

It has been confirmed that if a very thin oxide film is newly formed by the oxidizing process after the surface (surface of a Silicon nitride film, etc.) is etched as described above, a high $O_3$/TEOS CVD $SiO_2$ film can be formed on the surface having good compatibility with the oxide film and showing no surface dependency.

Since the Silicon nitride is a very stable compound, it cannot, in general, be oxidized at room temperature. When a thermal oxidizing method using Oxygen is employed for oxidizing the Silicon nitride film, it requires a high temperature near 1000° C. Since the high temperature treatment destroys the structure of the semiconductor substrate, such high temperature treatment cannot be employed.

Thus, according to the present invention, after the film-forming surface is chemically activated by the etching, the film-forming surface is oxidized. Therefore, the film-forming surface can be oxidized at a low temperature close to room temperature, and thus the surface dependency can be easily eliminated.

Particularly, since the aqueous solution containing the ammonia or the hydrazine compound has a small surface tension, and the gas of the reforming agent can diffuse into narrow and deep recesses, and both the solution and the gas can eliminate the surface dependency in such minute recesses.

Accordingly, the interlayer or cover insulating film, which is formed using the thermal CVD method on the surface whose surface dependency is eliminated, exhibits no surface roughness or voids, and no reduction in the film forming rate, and can fill the narrow and deep recesses completely.

The following findings have been confirmed experimentally:

(1) If the deposition surface is the surface of a Silicon nitride film, the surface dependency can be eliminated merely by exposing the surface to aqueous Hydrogen peroxide.

(2) If the deposition surface is the surface of a Silicon oxide film, the surface dependency can be eliminated merely by exposing the surface to an aqueous solution containing any one of $NO_2^-$ and $NO_3^-$.

In particular, in the case of (2), above $NO_2^-$ and $NO_3^-$ can be naturally produced in the mixed solution containing ammonia ($NH_3$), Hydrogen peroxide ($H_2O_2$), and pure water ($H_2O$). In this case, the $NO_2^-$ and $NO_3^-$ concentration that is effective in eliminating the surface dependency can be adjusted by mixing the ammonia ($NH_3$), the Hydrogen peroxide ($H_2O_2$), and the pure water ($H_2O$) to prepare the mixed solution, and then keeping the mixed solution at a predetermined temperature for a predetermined time.

Alternatively, the $NO_2^-$ and $NO_3^-$ can be produced by employing an aqueous solution into which nitric acid ($HNO_3$) has been added. In this case, the $NO_2^-$ and $NO_3^-$ concentration that is effective in eliminating the surface dependency can be adjusted to a desired value by adjusting the concentration of the added nitric acid ($HNO_3$).

BRIEF DESCRIPTION OF THE DRAWINGS

FIG. 16 is a sectional view showing the state after the CVD film is formed on the film-forming surface in the prior art.

DESCRIPTION OF THE PREFERRED EMBODIMENTS

Figure 1:
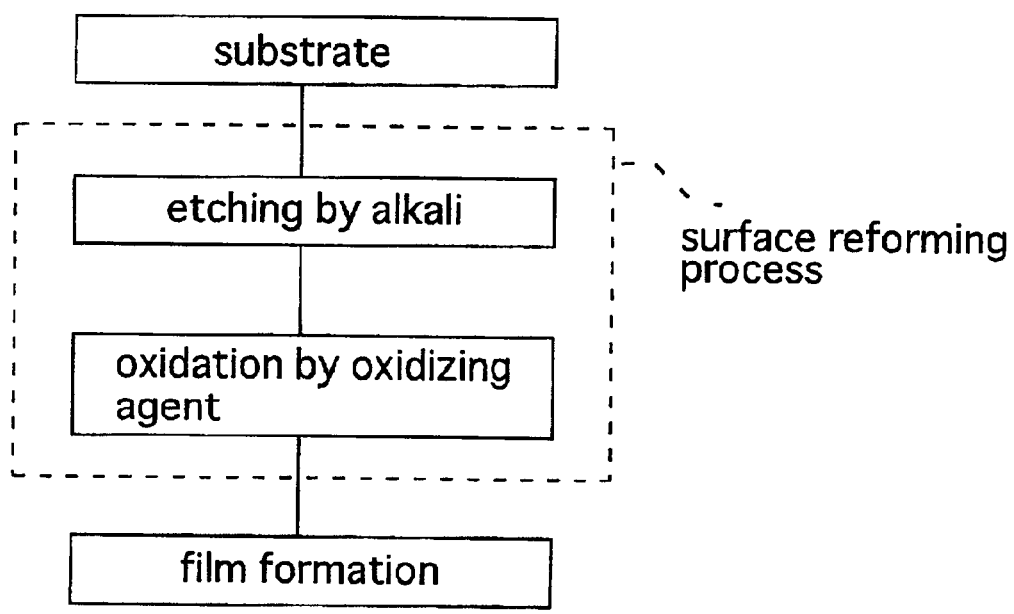
FIG. 1 is a flowchart showing a surface reforming method according to a first embodiment of the present invention.

Embodiments of the present invention will be explained with reference to the accompanying drawings hereinafter.

If the film is formed on a surface of a Silicon oxide film (the $SiO_2$ film, etc.), a Silicon nitride film (whose chemical formula is expressed as $Si_3N_4$ etc., but sometimes abbreviated as the "SiN film" hereinafter), or the like, film formation depends strongly upon the state of the film-forming surface and hence the film formation may exhibit abnormal growth. For example, if the film is formed on the surface of a thermal oxide film, or of a plasma CVD film that is not compatible with the $O_3$/TEOS reaction gas, or of an underlying insulating film formed by the low pressure thermal CVD method, the resultant film shows porosity, surface roughness, or reduction in the film forming rate. These disadvantages result because the film formation is strongly influenced by chemical properties of the film-forming surface.

Left in a clean room in which moisture is present, a surface of a Silicon oxide film and a Silicon nitride film will adsorb $H_2O$ or hydrate to form OH groups, which in turn makes the surface chemically inactive and hydrophilic. These are primary factors which disturb the smooth and uniform adsorption of the intermediate reaction product of the $O_3$/TEOS reaction gas, which exhibits oiliness, onto the film-forming surface. This, in turn, causes problems in uniform film formation, recess filling, and uniform flowability during the formation of the high $O_3$/TEOS NSG film ("NSG film" means a Silicon oxide film that does not contain an impurity such as phosphorus, boron, or the like).

Accordingly, it is supposed that abnormal film formation can be suppressed if the adsorption sites for the intermediate product are increased in the film-forming surface to promote uniform adsorption.

According to the plasma irradiation of the conventional method, the moisture on the surface, etc., can be removed by the plasma irradiation and the heat, and hence defects are introduced into the insulating film and also the minute surface unevenness of the film-forming surface. It may be supposed that the defects in the insulating film and the minute surface unevenness act as the surface adsorption sites for the intermediate product of the $O_3$/TEOS reaction gas.

In the case of the conventional method that employs a low $O_3$/TEOS CVD $SiO_2$ film as the underlying layer, it is supposed that since the low $O_3$/TEOS CVD $SiO_2$ film is an inferior film as compared to the high $O_3$/TEOS CVD $SiO_2$ film and thus many defects are contained in the film, these defects act as the adsorption sites for the intermediate product to promote uniform adsorption of the intermediate product.

The thermal oxide film, the Silicon oxide film and the Silicon nitride film formed by the thermal CVD method are very superior films, and are thermally stable and do not contain many defects. If an attempt is made to chemically form the Silicon oxide film on these surfaces, a high temperature such as about 1000° C. is required to directly oxidize the films because the Silicon oxide film and the Silicon nitride film are chemically stable.

It is well known that an inorganic or organic alkaline aqueous solution can dissolve the surfaces of the Silicon oxide film and the Silicon nitride film and thus etch these films. The film-forming surface that is etched by these etching agents is chemically active and has minute unevenness or etching pores. The state in which a large number of pores are formed is called the porous state. It is considered that since the surface area of such a surface is increased by the etching pores and such a surface is chemically active, the surface can easily be oxidized by the oxidizing agent and thus an extremely thin oxide layer can be formed on the surface.

It is considered that the Silicon oxide film formed chemically in this manner contains a large number of defects and thus the surface has a porous state. The defects in the film and the minute surface unevenness can act as the surface adsorption sites for the intermediate product of the $O_3$/TEOS reaction gas, which in turn promotes the uniform adsorption of the intermediate product to the surface, thus promotes formation of the high $O_3$/TEOS CVD $SiO_2$ film, and thereby eliminates the surface dependency completely. Thus, the film formation can be performed while maintaining a growth rate and film property totally the same as those obtained when the film is formed on Silicon substrate surface.

Etching Agent

In the present invention, an inorganic or organic alkali is employed as the etching agent. More specifically, ammonia ($NH_3$), hydrazine (($NH_2)_2$), or an amino group (—$NH_2$) based compound are employed. The reasons for employing the inorganic or organic alkali as the etching agent are that a substantially equal etching rate can be obtained irrespective of the type of the Silicon oxide film or the Silicon nitride film and that the surface dependency can be completely eliminated. In contrast, a fluorine-based etching agent is not suitable for the etching agent of the present invention since firstly the etching rate of the Silicon oxide film becomes extremely faster than that of the Silicon nitride film, and secondly it is difficult to eliminate the surface dependency of the film-forming surface made of the Silicon oxide film.

(a) Ammonia ($NH_3$)

Ammonia is a gas at normal temperature. The aqueous solution is aqueous ammonia $NH_3$, $H_2O$. In the following, for convenience of explanation, in some cases the aqueous ammonia is called ammonium hydroxide $NH_4OH$. Also, a compound expressed by the chemical formula $NH_nR_{4-n}OH$ (n=1 to 4, R: alkyl group) may be employed as a derivative of the ammonium hydroxide. For example, if n=2 and R=$CH_3$ in the above chemical formula, dimethylammonium hydroxide ($N(CH_3)_2H_2OH$) is obtained.

(b) Hydrazine (($NH_2)_2$)

Hydrazine is a liquid at normal temperature. In aqueous solution it becomes hydrazine-hydrate ($N_2H_4H_2O$, $N_2H_5OH$), an alkali. Also, ($NR_2)_2$ (wherein R is an alkyl group such as $CH_3$, $C_2H_5$, $C_3H_7$, etc., or an aryl group) may be employed as a derivative of the hydrazine. If R is $CH_3$, dimethylhydrazine $N_2(CH_3)_4$ is obtained.

(c) Amine

An amine is a compound in which the Hydrogen atom of the ammonia is replaced with an organic group (R) such as an alkyl group, an aryl group (the benzene nucleus), etc., and is included in the term "organic alkali" as used herein.

$NR_nH_{3-n}$(n=1,2,3), etc., may be used as the amine.

(d) Amino compound

An amino compound is the organic compound having the amino group (—$NH_2$).

Aminobenzene (aniline)($C_6H_5NH_2$), aminophenol ($C_6H_4NH_2OH$), etc., may be used as the amino compound.

Common features of these etching agents of (a) to (d) are that (i) they are alkaline, (ii) they can be used in aqueous solution, and (iii) they are adsorbed onto the film-forming surface of the Silicon oxide or the Silicon nitride to produce excellent wettability. Accordingly, the etching agent of the present invention is not limited to the particular examples (a) to (d) given above, but any agent may be used as the etching agent of the present invention if it has the above properties.

Oxidizing Agent

In the present invention, a gas or aqueous solution containing any member selected from the group consisting of Hydrogen peroxide, ozone, Oxygen, nitric acid, sulfuric acid, and their derivatives may be used as the oxidizing agent.

(a) Hydrogen peroxide

Hydrogen peroxide is a liquid at normal temperature. Hydrogen peroxide dissociates to produce water ($H_2O$) and the Oxygen atom (O) in the nascent state. The Hydrogen peroxide is known as a strong oxidizing agent.

(b) Ozone

Ozone is a gas at normal temperature. Ozone dissociates to produce the Oxygen molecule ($O_2$) and the Oxygen atom (O) in the nascent state. Also, ozone dissolves into water to form ozone water which can be used as the oxidizing agent.

(c) Nitric acid ($HNO_3$) and Sulfuric acid ($H_2SO_4$)

Both nitric acid and sulfuric acid are liquid at normal temperature. Aqueous solutions of these acids in high concentrations exhibit the oxidizing property. Also, nitrous acid ($HNO_2$) and sulfurous acid ($H_2SO_3$) can be used as the oxidizing agent.

Common features of these oxidizing agents of (a) to (c) are (i) they function as oxidizing agents in vapor phase or in solution, (ii) they can be used in gas phase or in aqueous solution, (iii) they are adsorbed onto the surface of the Silicon oxide and the Silicon nitride to provide excellent wettability, and (iv) they do not dissolve the generated Silicon oxide. Accordingly, the oxidizing agent of the present invention is not limited to the particular examples of (a) to (c), but any agent may be used as the oxidizing agent in the present invention if it has the above properties.

In the following, in some cases the above etching agent and the above oxidizing agent are referred to as a "surface reforming liquid".

First Embodiment

Next, a film-forming surface reforming method according to a first embodiment of the present invention and a semiconductor device manufacturing method employing this reforming method will be explained.

FIG. 1 is a flowchart showing the surface reforming method according to the first embodiment of the present invention and a semiconductor device manufacturing method employing this reforming method. FIGS. 2A to 2D are sectional views showing the surface reforming method and the semiconductor device manufacturing method according to the first embodiment of the present invention.

Figure 2A:
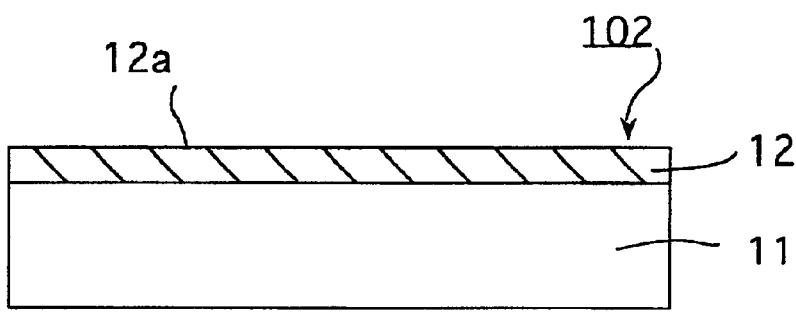
FIGS. 2A to 2D are sectional views showing the surface reforming method according to the first embodiment of the present invention.

First, an underlying layer 12 is formed on a semiconductor substrate 11 made of Silicon. After the Silicon oxide film is formed as the underlying layer 12, the semiconductor substrate 11 is put into the oxidizing furnace and then heated up to about 1100° C. in an Oxygen atmosphere. Accordingly, as shown in FIG. 2A, a surface of the semiconductor substrate 11 is oxidized and thus the thermal oxide film (underlying layer) 12 made of $SiO_2$ is formed.

Also, if a Silicon nitride film is formed as the underlying layer 12, the semiconductor substrate 11 made of Silicon is put into the low pressure CVD apparatus, and then the Silicon nitride film (underlying layer) 12 is formed at about 750° C. by the low pressure CVD method using a reaction gas consisting of dichlorsilane ($SiH_2Cl_2$) and ammonia ($NH_3$).

The Silicon oxide film or the Silicon nitride film serves as the underlying layer 12 in the film formation, and a surface of the underlying layer 12 serves as a film deposition surface 12a. These constitute a substrate 102. In some cases, wirings are formed on the thermal oxide film or of the Silicon nitride film 12. In this case, the overall structure including the wirings constitute the substrate 102.

In the step of forming this underlying layer 12, the plasma CVD method, the low pressure CVD method, etc., may be employed in the alternative.

Figure 3A:
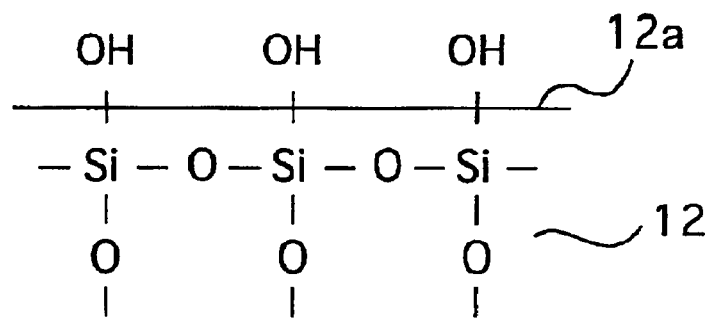
FIGS. 3A to 3C are views showing states of the surface of the underlying layer formed of a $SiO_2$ film in a series of steps in the reforming process according to the first embodiment of the present invention.
Figure 4A:
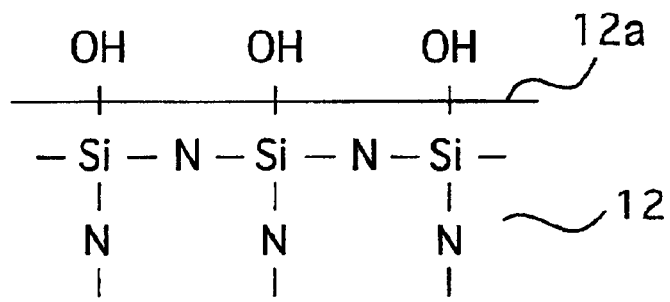
FIGS. 4A to 4C are views showing states of the surface of the underlying layer formed of a SiN film in a series of steps in the reforming process according to the first embodiment of the present invention.

As shown in FIG. 3A and FIG. 4A, the surface of the underlying layer 12 immediately after it is formed, (both the Silicon oxide film and the Silicon nitride film) hydrate by contact with the air containing moisture, and thus become chemically inactive.

Figure 2B:
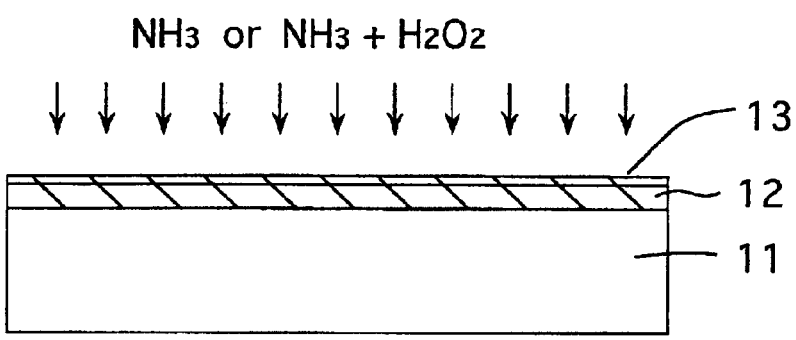
Figure 3B:
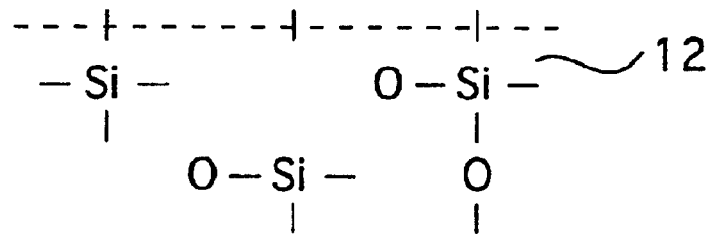
Figure 4B:
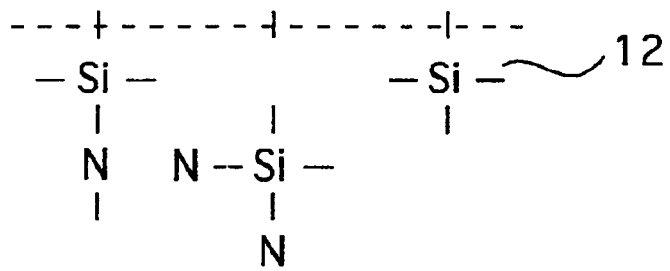

Then, as shown in FIG. 2B, the substrate 102 is dipped into an etching agent in the form of an aqueous ammonia or a mixed solution of $NH_3+H_2O_2$. At this time, the surface of the underlying layer 12 is etched by the ammonia and thus a porous layer 13 is formed on a surface layer. A number of dangling bonds of Silicon are formed in the porous layer 13. The state of the surface of the underlying layer 12 is shown in FIG. 3B and FIG. 4B.

Figure 2C:
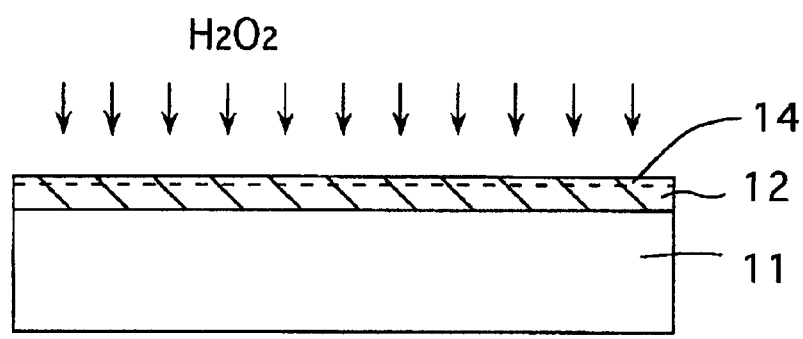
Figure 3C:
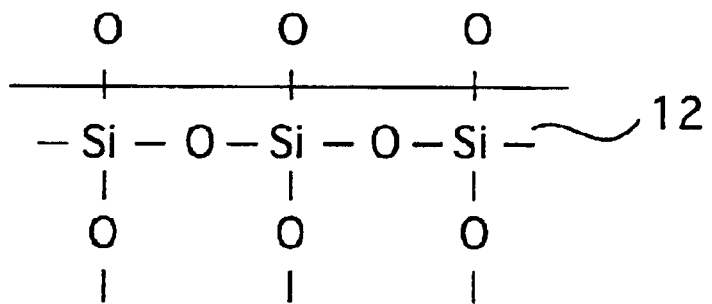
Figure 4C:
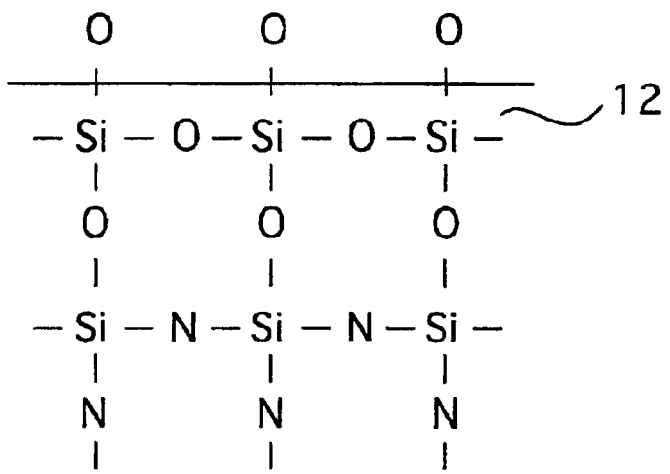

Then, as shown in FIG. 2C, the substrate 102 is dipped into aqueous Hydrogen peroxide (oxidizing agent) after the substrate 102 is rinsed. This permits the dangling bonds of Silicon atom contained in the porous layer 13 to bond to Oxygen atoms, whereby the porous layer 13 is oxidized. By this oxidization, the surface of the underlying layer 12 is covered with very thin layer 14 of Silicon oxide. The state of the surface of the underlying layer 12 at this time is shown in FIG. 3C and FIG. 4C.

Then, after the substrate 102 is rinsed, the surface 12a is dried by the heating, the spin drying, etc. Alternatively, the residual water on the surface may be removed by use of isopropyl alcohol vapor. Upon completion of this step, the surface reforming process is completed.

Subsequent to the above reforming process, the substrate 102 is put into the reaction chamber of the film forming apparatus, and then the high $O_3$/TEOS film forming gas is supplied into the reaction chamber.

Figure 2D:
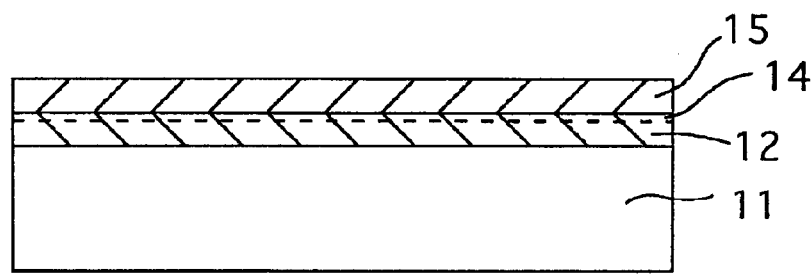

Then, the substrate 102 is heated to a temperature in the range of 400 to 500° C. to make the $O_3$ and TEOS thermally react with each other. Then, as shown in FIG. 2D, a high $O_3$/TEOS CVD $SiO_2$ film 15 is formed on the underlying layer 12 after such state is held for a predetermined time.

Figure 5:
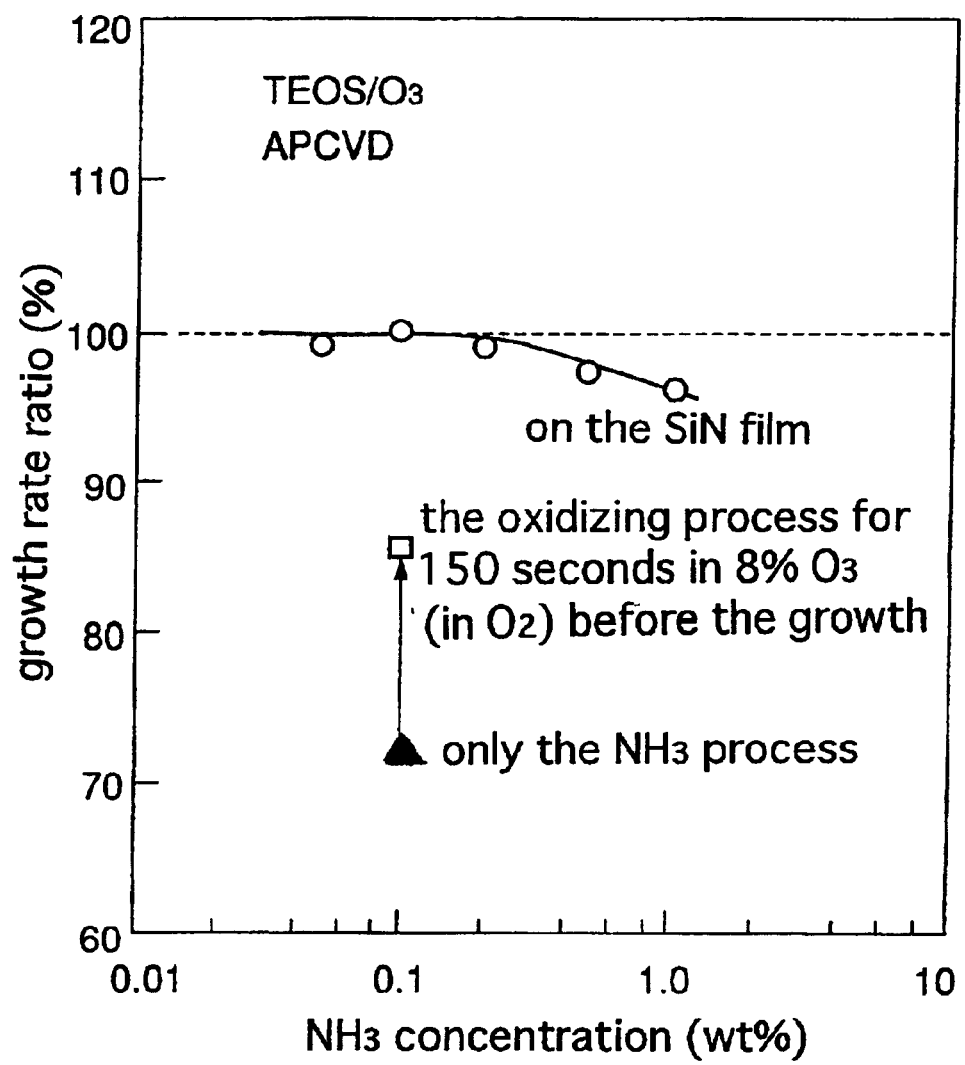
FIG. 5 is a graph showing the growth rate of the high $O_3$/TEOS CVD $SiO_2$ film versus the concentration of the ammonia aqueous solution of the etching agent according to the first embodiment of the present invention.

FIG. 5 is a graph showing the growth rate of the high $O_3$/TEOS CVD $SiO_2$ film versus the concentration of the ammonia aqueous solution used as the etching agent. In these experiments, samples were subjected to a two-step process, in which the surface treatment using ammonia aqueous solution and oxidizing agent were separately carried out as described above. Exposed at the surface of the sample was the Silicon nitride film, which served as the underlying layer and whose surface served as the film deposition surface.

The ordinate denotes the growth rate ratio (%) represented in a linear scale, and the abscissa denotes the $NH_3$ concentration (wt %) represented in a logarithmic scale. The growth rate ratio is defined as a ratio of the growth rate on the surface under consideration to that on the surface of a Silicon single crystal substrate that exhibits no surface dependency. In this experiment, the growth rate on the Silicon single crystal substrate was 60 nm/min, and the growth rate ratio was calculated based on this value. For sake of comparison, other growth rate ratios were measured when a high $O_3$/TEOS CVD $SiO_2$ film was formed on the surface that was subjected only to the treatment using the $NH_3$, i.e., not to the treatment using the oxidizing agent. A ▲ mark indicates the growth rate ratio of the sample which was subjected to such surface treatment. A □ mark indicates the growth rate ratio on the sample that was subjected to the surface treatment using the $NH_3$, followed by a surface oxidation for 150 seconds with heating at a temperature of about 450° C. in the atmosphere containing 8 mol % $O_3$ in $O_2$ before the film formation.

As shown in FIG. 5, the growth rate ratio of the high $O_3$/TEOS CVD $SiO_2$ film shows a value close to 100% over a wide range of ammonia concentration of 0.05 wt % to 1.0 wt %. In contrast, the growth rate ratio was only about 60% for the sample indicated by the ▲ mark, whereas the growth rate ratio is considerably improved to about 87% for the sample indicated by the □ mark.

It can be understood based on the foregoing findings that not only the etching process using the aqueous ammonia but also the subsequent oxidizing process using the aqueous Hydrogen peroxide or the ozone atmosphere is effective to eliminate surface dependency in formation of the high $O_3$/TEOS CVD $SiO_2$ film. As shown in FIG. 5, among various samples, the sample that is subjected to the surface treatment using the aqueous ammonia solution having an ammonia concentration of less than 0.1 wt % is particularly preferable. Accordingly, a high $O_3$/TEOS CVD $SiO_2$ film having no void and a smooth surface can be formed.

Figure 6:
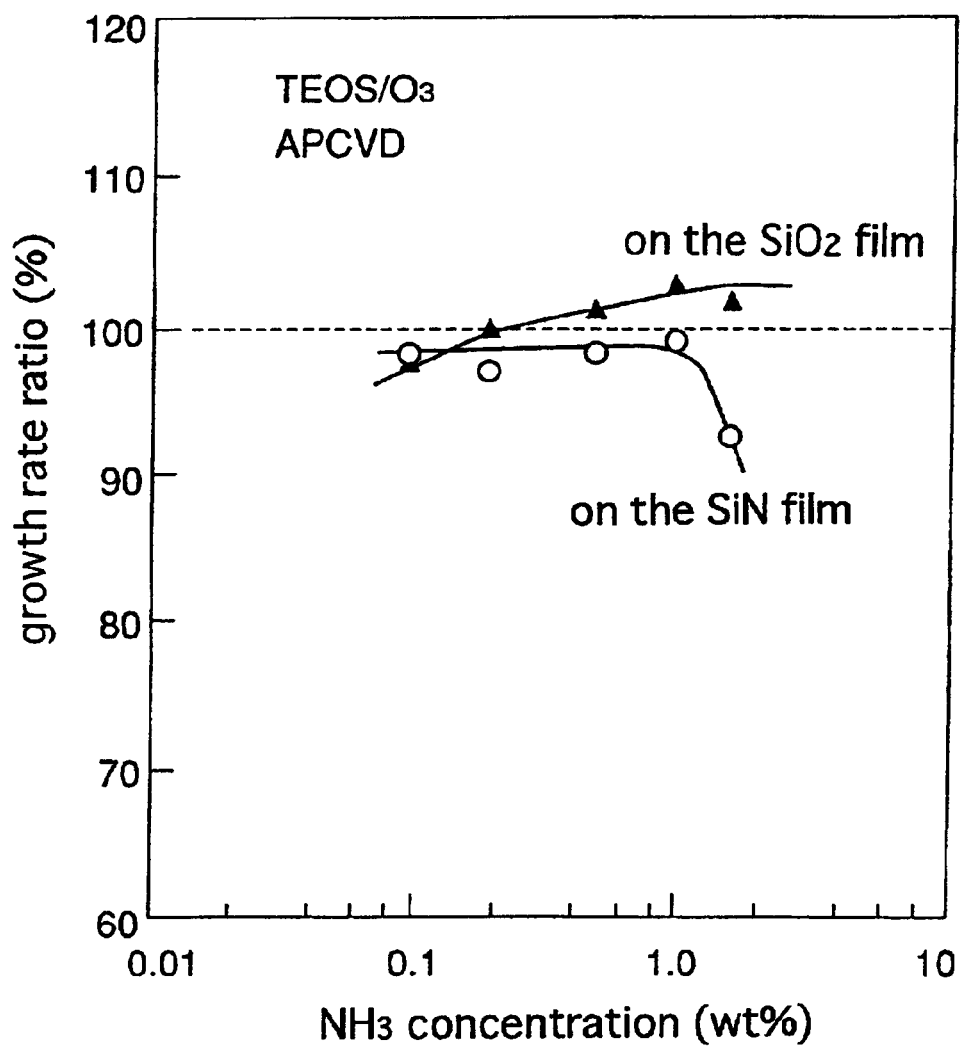
FIG. 6 is a graph showing the growth rate of the high $O_3$/TEOS CVD $SiO_2$ film versus the $NH_3$ concentration of the etching agent, when a mixture of aqueous ammonia and aqueous Hydrogen peroxide was employed as the etching agent in the first embodiment of the present invention.

Another case was also examined, in which a mixed liquid of the aqueous ammonia and the aqueous Hydrogen peroxide was employed instead of aqueous ammonia as the etching agent. In these experiments, the ammonia concentration in the aqueous solution was varied between 0.1 to 1.6 wt % while keeping the concentration of the Hydrogen peroxide constant at 4 wt %. FIG. 6 is a graph showing the results. The ordinate denotes the growth rate ratio (%) represented on a linear scale, and the abscissa denotes the $NH_3$ concentration (wt %) represented on a logarithmic scale. The growth rate ratio is calculated based on the growth rate 60 nm/min on the Silicon single crystal substrate that has no surface dependency.

For sake of comparison, the growth rate ratio (○ mark) obtained when the high $O_3$/TEOS CVD $SiO_2$ film is formed on the Silicon oxide film ($SiO_2$ film) and the growth rate ratio (▲ mark) obtained when the high $O_3$/TEOS CVD $SiO_2$ film is formed on the Silicon nitride film (SiN film) were examined. As shown in FIG. 6, for both the ○ mark and mark ▲ samples, the growth rate ratio of the high $O_3$/TEOS CVD $SiO_2$ film gave a value close to 100% over a wide range of ammonia concentration from 0.05 wt % to 1.0 wt %. Accordingly, a high $O_3$/TEOS CVD $SiO_2$ film having no void and a smooth surface can be formed.

In yet another experiment, the growth rate was measured with neither the etching treatment using the $NH_3$ nor the oxidizing treatment. The thus obtained growth rate ratio was only about 40% on the thermal oxide film and about 60% on the Silicon nitride film, which is apparently inferior compared to the present invention.

As described above, according to the first embodiment of the present invention, since the film formation using the $O_3$/TEOS reaction gas is carried out after reforming the film deposition surface, especially the surfaces of a Silicon oxide film or a Silicon nitride film, the flowability, the planarity, the recess filling, and the step coverage of the formed high $O_3$/TEOS CVD $SiO_2$ film 13 are improved.

In particular, since the film-forming surface is covered with the chemically stable layer 14 of Silicon oxide, the reforming effect can be maintained. That is, even if the substrate 102 was left in the air for 10 days or more after its film deposition (receiving) surface 12a was reformed, the high $O_3$/TEOS CVD $SiO_2$ film 13 could be formed on the surface 12a with good flowability, planarity, recess filling, and step coverage.

Second Embodiment

Next, a film surface reforming method and a semiconductor device manufacturing method employing this reforming method according to a second embodiment of the present invention will be explained.

In the first embodiment of the present invention, a two-step surface reforming process such as (the etching by the alkali)+(the oxidation by the oxidizing agent) is performed (see FIG. 1). This two-step surface reforming process is effective in both cases, i.e., the case where the underlying layer is a Silicon oxide film and the case where the underlying layer is a Silicon nitride film.

However, if the underlying layer is either a Silicon oxide film or a Silicon nitride film, the one-step process of this second embodiment is also effective. This one-step process will be explained hereunder. In the following, terms defined in the description of the first embodiment are not repeated here.

Silicon Nitride Film Underlying Layer

This case will be explained with reference to FIGS. 7A to 7C.

Figure 7A:
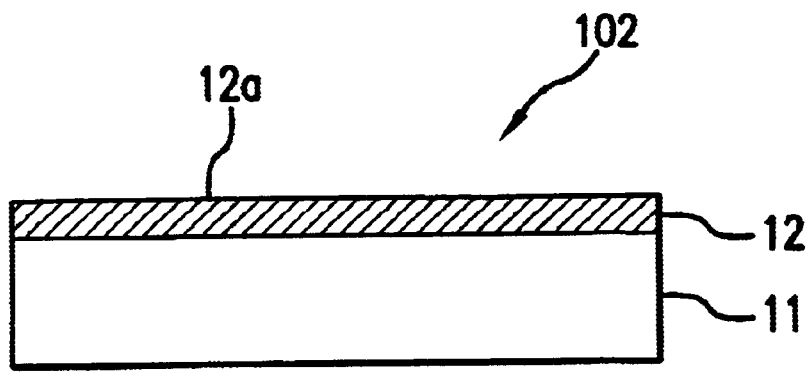
FIGS. 7A to 7C are sectional views showing a substrate surface reforming method according to a second embodiment of the present invention when an underlying surface is formed of a Silicon nitride film.

First, as shown in FIG. 7A, the substrate 102 is prepared by forming the Silicon nitride film (underlying layer) 12 on the semiconductor substrate 11 made of Silicon. The surface of the Silicon nitride film 12 serves as the film deposition surface 12a. This Silicon nitride film 12 is formed by a well-known film forming method, for example the low pressure CVD method using a reaction gas consisting of dichlorsilane ($SiH_2Cl_2$) and ammonia ($NH_3$). In this case, the film forming temperature of the Silicon nitride film 12 is set to about 750° C., for example.

Figure 7B:
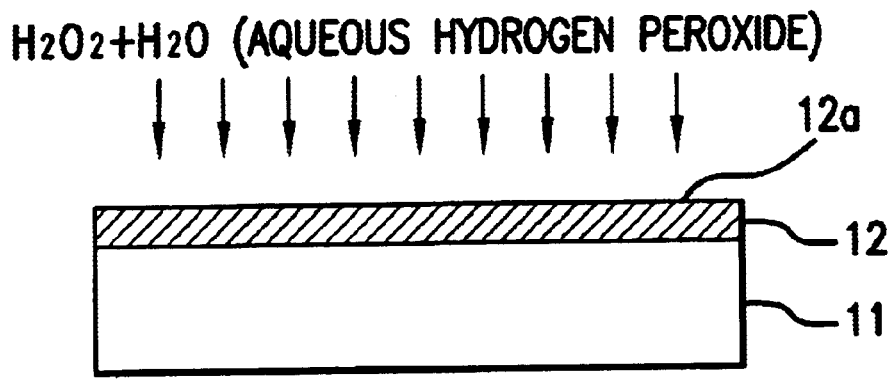

Then, as shown in FIG. 7B, the substrate 102 is dipped into aqueous Hydrogen peroxide serving as an oxidizing agent. By this dipping, the film-forming surface 12a is contacted with the aqueous Hydrogen peroxide, and thus the film deposition surface 12a is reformed. The surface reforming conditions in this case are as follows.

the Hydrogen peroxide concentration: 1.0 to 5.0%
the Hydrogen peroxide temperature: 60 to 80° C.
the processing time: 10 to 20 minutes When the surface is reformed in accordance with these conditions, the growth rate ratio become 105 to 106%.

After the surface is reformed, the substrate 102 is rinsed. Then, the film-forming surface 12a is dried by heating, spin drying, etc. Alternatively, the residual water on the surface may be removed with an isopropyl alcohol vapor. Upon completion of this step, the surface reforming process is completed.

Figure 7C:
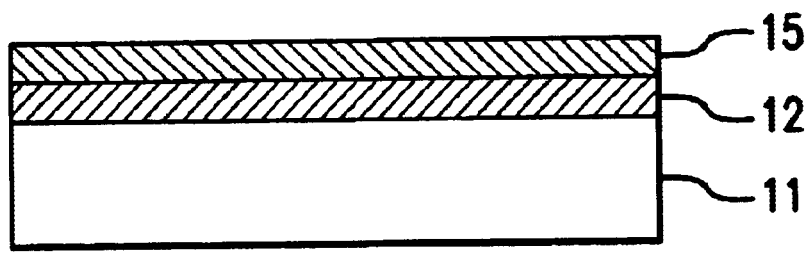

Then, as shown in FIG. 7C, the substrate 102 is put into a reaction chamber (not shown) of the film forming apparatus, and then the high $O_3$/TEOS film forming gas is supplied into the reaction chamber. Then, the substrate 102 is heated to a temperature in the range of 400 to 500° C. to make the $O_3$ and TEOS thermally react with each other. As shown in FIG. 7C, the high $O_3$/TEOS CVD $SiO_2$ film 15 is formed by holding this state for a predetermined time.

Figure 13A:
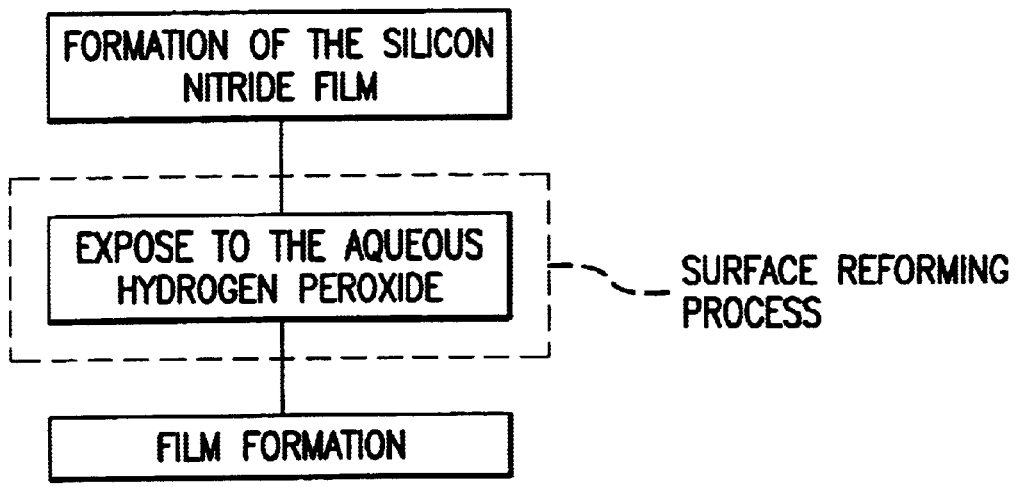
FIG. 13A is a flowchart showing the surface reforming process when the underlying layer is the Silicon nitride film.

FIG. 13A is a flowchart showing the above one-step process when the underlying layer is a Silicon nitride film.

Figure 8:
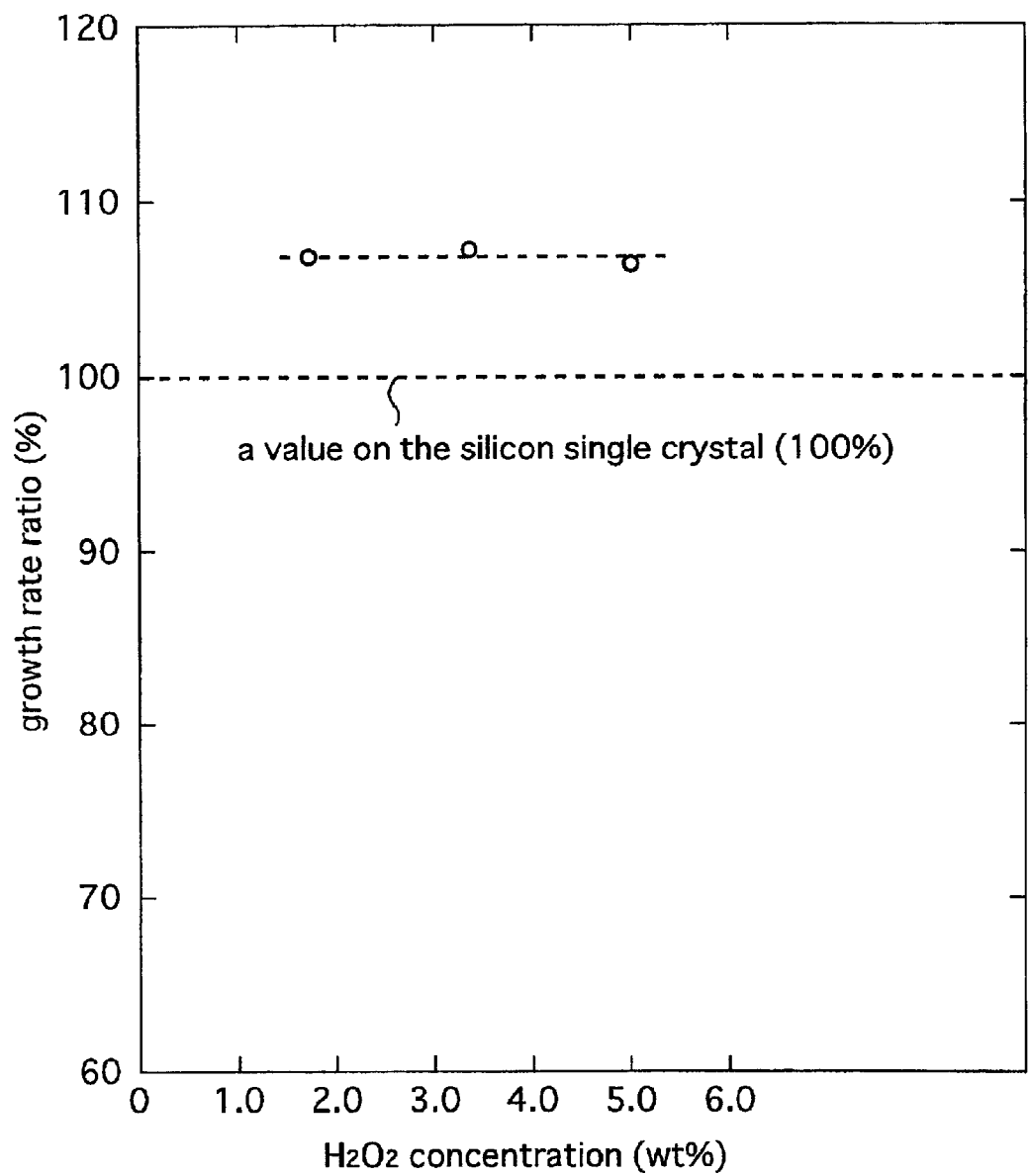
FIG. 8 is a graph showing a relationship between a $H_2O_2$ concentration and a growth rate ratio when the underlying surface is formed of a Silicon nitride film, in the second embodiment of the present invention.

FIG. 8 is a graph showing a relationship between the Hydrogen peroxide concentration and the growth rate ratio when the surface reforming conditions are set as follows.

the aqueous Hydrogen peroxide temperature: 80° C.
the process time: 10 minutes

It should be noted that the growth rate ratio is calculated based on the growth rate 60 nm/min on the Silicon single crystal substrate that has no surface dependency. As shown in FIG. 8, when the concentration of the Hydrogen peroxide is in the range of 1.7 to 5%, the growth rate ratio becomes about 105%, which is larger than that (100%) on the Silicon single crystal substrate. This means that the surface dependency of the surface 12a of the Silicon nitride film 12 can be completely eliminated.

According to.this one-step process, since the step of etching with the alkali required in the first embodiment is not needed, the surface reforming process can be simplified.

Silicon Oxide Film Underlying Layer

This case will be explained with reference to FIGS. 9A to 9C hereunder.

Figure 9A:
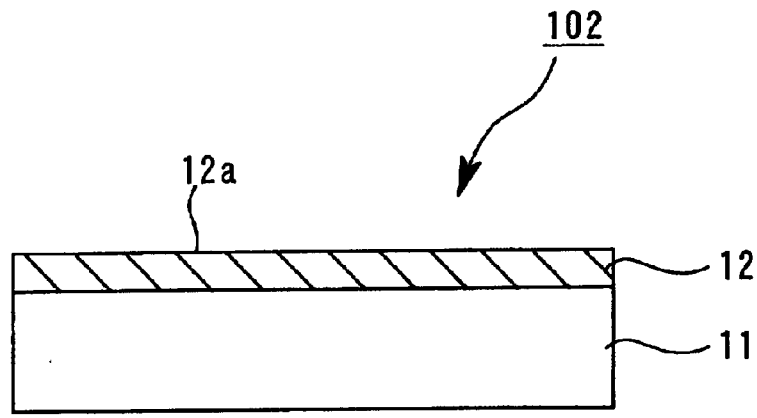
FIGS. 9A to 9C are sectional views showing a surface reforming method according to the second embodiment of the present invention when the underlying surface is formed of a Silicon oxide film.
Figure 9B:
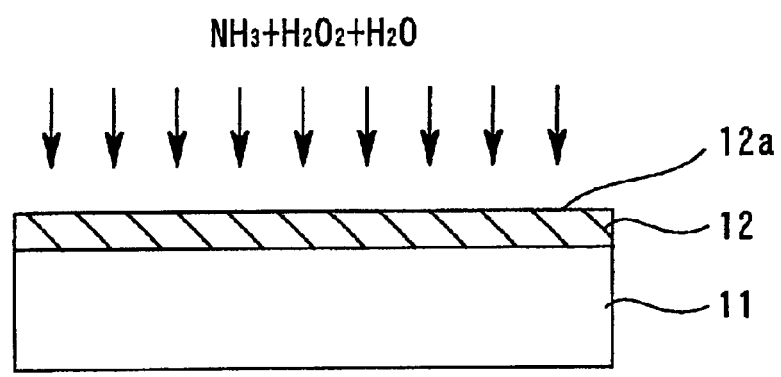

First, as shown in FIG. 9A, the substrate 102 is prepared by forming Silicon oxide film (underlying layer) 12 on the semiconductor substrate 11 made of Silicon. For example, the Silicon oxide film 12 is formed by putting the semiconductor substrate 11 into an oxidizing furnace (not shown) and then heating it at about 1100° C. in an Oxygen atmosphere. Alternatively, the Silicon oxide film 12 may be formed by the well-known thermal CVD method, or the plasma CVD method. Then, as shown in FIG. 9B, the substrate 102 is dipped into the surface reforming liquid that consists of the mixed solution of $NH_3+H_2O_2+H_2O$. It is to be understood that when the term "surface reforming liquid" is used in the following explanation, it is meant to refer to the $NH_3+H_2O_2+H_2O$ solution. By this dipping, the film-forming surface 12a is contacted with the surface reforming liquid, and thus the film-forming surface 12a is reformed. The surface reforming conditions and the reforming effect in this case are described later.

After the surface is reformed, the substrate 102 is rinsed. Then, the film-forming surface 12a is dried by heating, spin drying, etc. Alternatively, the residual water on the surface may be removed by use of an isopropyl alcohol vapor.

Upon completion of this step, the surface reforming process is completed.

Figure 9C:
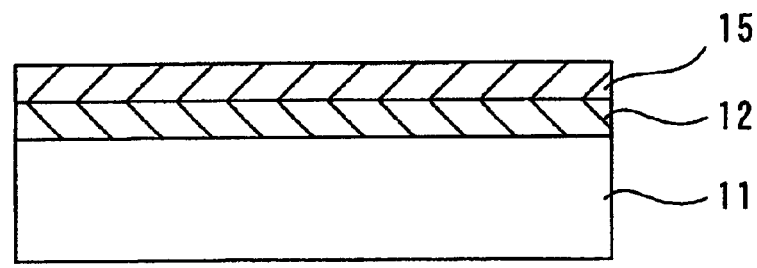

Then, as shown in FIG. 9C, the substrate 102 is put into a reaction chamber (not shown) of the film forming apparatus, and then the high $O_3$/TEOS film forming gas is supplied into the reaction chamber. Then, the substrate 102 is heated to a temperature range of 400 to 500° C. to make the $O_3$ and TEOS thermally react with each other. As shown in FIG. 9C, the high $O_3$/TEOS CVD $SiO_2$ film 15 is formed by holding this state for a predetermined time.

Figure 10:
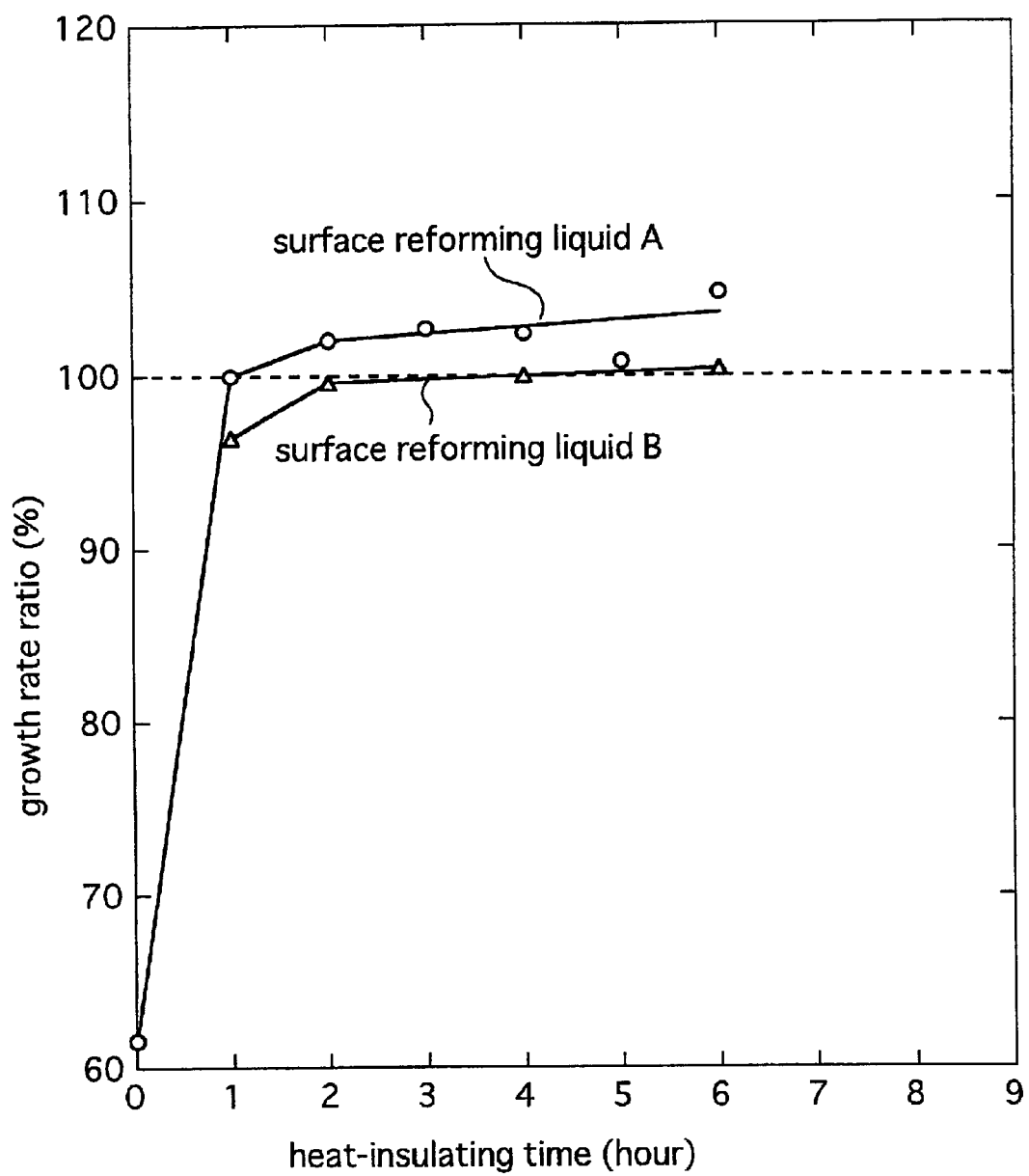
FIG. 10 is a graph showing a relationship between a heat-insulating time and the growth rate ratio when liquids having a volume ratio 1:1:5 and 1:10:50 for aqueous ammonia (30 wt %), aqueous Hydrogen peroxide (30 wt %), and pure water are used as the surface reforming liquids when the underlying surface is formed of a Silicon oxide film, in the second embodiment of the present invention.

FIG. 10 is a graph showing a relationship between the heating time with the surface reforming liquid and the growth rate ratio obtained experimentally. In this experiments, surface reforming liquids A and B were used. Composition of the surface reforming liquid A was, by volume ratio, 1:1:5 for the aqueous ammonia (30 wt %), the aqueous Hydrogen peroxide (30 wt %), and the pure water, respectively. On the other hand, composition of the surface reforming liquid B was, by volume ratio, 1:10:50 for the aqueous ammonia (30 wt %), the aqueous Hydrogen peroxide (30 wt %), and the pure water, respectively.

It is to be understood that the "heating time" is defined as the time during which the surface reforming liquids are maintained at a predetermined temperature (80° C. in this experiment) after the aqueous ammonia, the aqueous Hydrogen peroxide, and the pure water are mixed to form the surface reforming liquids. In this experiment, the process time was 10 minutes.

As can be seen from FIG. 10, the surface dependency of the Silicon oxide film 12 cannot be eliminated immediately after the surface reforming liquid is mixed, and thus the growth rate ratio remains at 60%. This value is identical to a value exhibited by the Silicon oxide film 12 which is not subjected to the reforming treatment. Thus, the reforming effect is unstable immediately after the surface reforming liquid is mixed.

However, after one hour had elapsed while keeping the temperature of the surface reforming liquid at 80° C., the growth rate ratio after the process is increased up to 100% ,and shows a value of more than 100% after the time had further elapsed.

This is because the ammonia is oxidized by the Hydrogen peroxide in the surface reforming liquid in which the ammonia concentration is relatively high, whereby the nitrous acid ion ($NO_2^-$) and the nitric acid ion ($NO_3^-$) are generated in the surface reforming liquid, and these nitric acid based ions ($NO_2^-$, $NO_3^-$) are effective in eliminating the surface dependency.

Figure 13B:
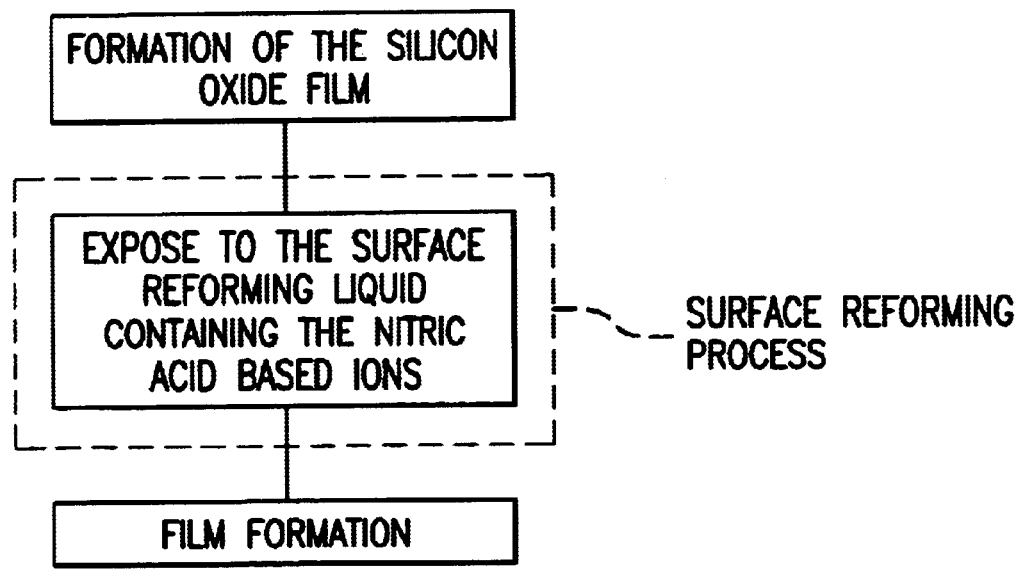
FIG. 13B is a flowchart showing the surface reforming process when the underlying layer is the Silicon oxide film, in the second embodiment of the present invention.

Since this one-step process does not need special equipment and is carried out utilizing existing standard wafer cleaning equipment, such a one-step process can be easily introduced into the existing manufacturing. FIG. 13B is a flowchart showing this one-step process.

In the above explanation, it is mentioned that the nitric acid based ions ($NO_2^-$, $NO_3^-$) in the surface reforming liquid are effective in eliminating the surface dependency. The following, first to third experiments support this assertion.

In a first experiment, the spectrum of the surface reforming liquid A that was heated at the temperature of 80° C. for 6 hours was measured by the microscopic FTIR (Fourier Transform Infrared Absorption Spectroscopy). It was apparent from a comparison of the measured spectrum with the standard spectrum that the nonvolatile substance in the liquid was ammonium nitrate ($NH_4NO_3$). This shows that the nitric acid based ion was generated in the liquid.

In the second experiment, the relationship between the heating time at a temperature of 80° C. and concentration of the nitric acid based ion in the surface reforming liquid was determined. A surface reforming liquid which had a volume ratio of 1:3:15 of aqueous ammonia (30 wt %), aqueous Hydrogen peroxide (30 wt %), and pure water, respectively, was used. In this experiment, ion chromatography was employed with the results shown in FIG. 11.

Figure 11:
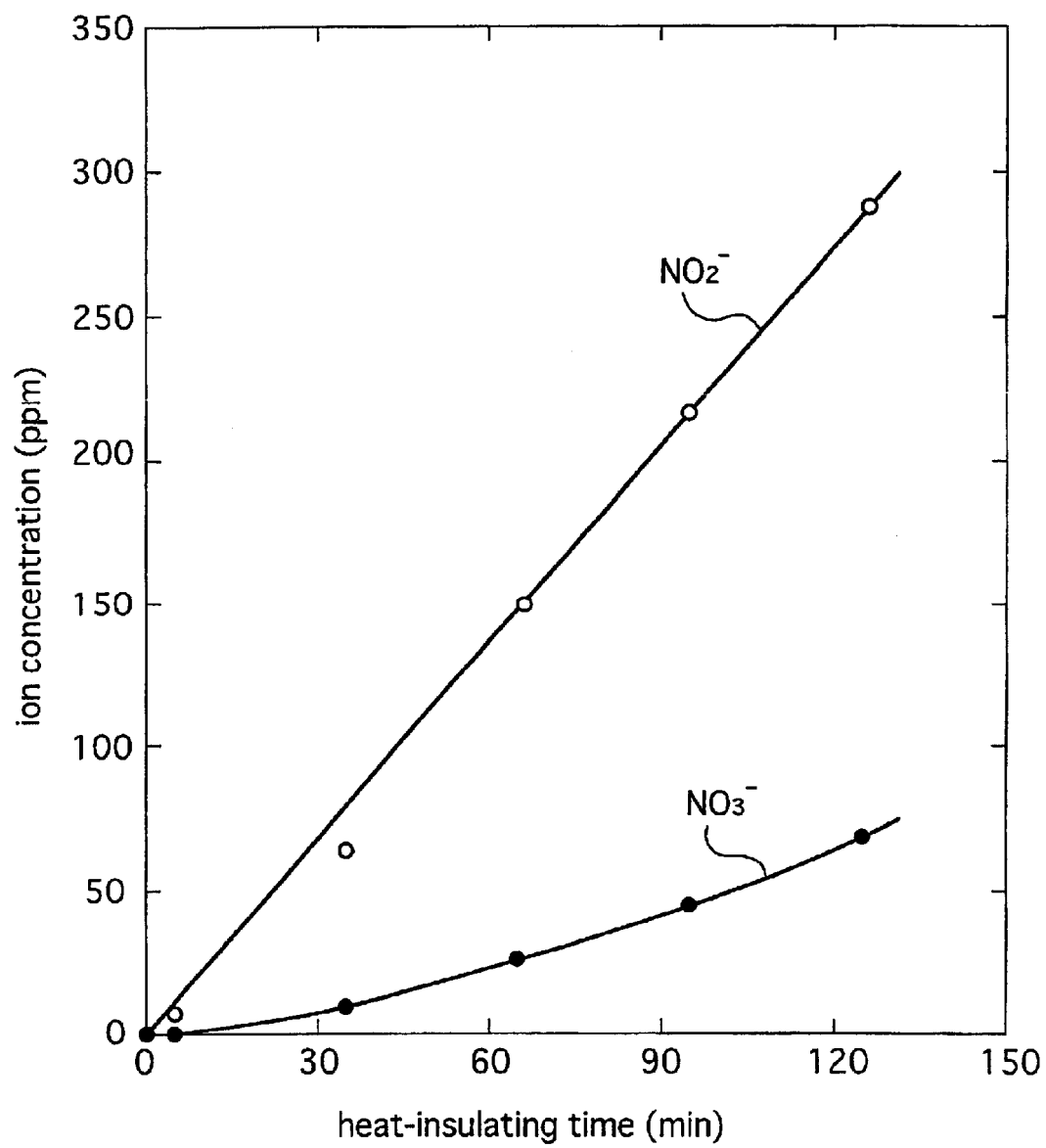
FIG. 11 is a graph showing a relationship between the heat-insulating time and a concentration of nitric acid based ions in the surface reforming liquid at a temperature of 80° C. in the second embodiment of the present invention.

As shown in FIG. 11, the nitric acid based ion of several 100 ppm is generated in the liquid after one hour of heating. It can also be observed that the concentration of the nitrous acid ion $NO_2^-$, which is precursor of the $NO_3^-$, is higher than that of the $NO_3^-$.

It should be noted that the increase of the growth rate ratio shown in FIG. 10 corresponds well to the increase of the nitric acid based ion shown in FIG. 11. Accordingly, it can be understood that any one of $NO_2^-$ and $NO_3^-$ or both are effective in eliminating the surface dependency of the insulating film.

Also, as shown in FIG. 11, the concentration of the nitric acid based ions ($NO_2^-$, $NO_3^-$) in the surface reforming liquid can be adjusted by heating the surface reforming liquid at a predetermined temperature for a predetermined time after the surface reforming liquid is mixed.

In the third experiment the relationship between the concentration of nitric acid and the growth rate ratio was measured when nitric acid was added into the surface reforming liquid. The surface reforming liquid used in this examination had a volume ratio of 1:4:20 for the aqueous ammonia (30 wt %), the aqueous Hydrogen peroxide (30 wt %), and the pure water, respectively, and was used shortly after mixing. The surface reforming conditions in this experiment were as follows.

the surface reforming liquid temperature : 80° C.

the process time : 10 minutes

Figure 12:
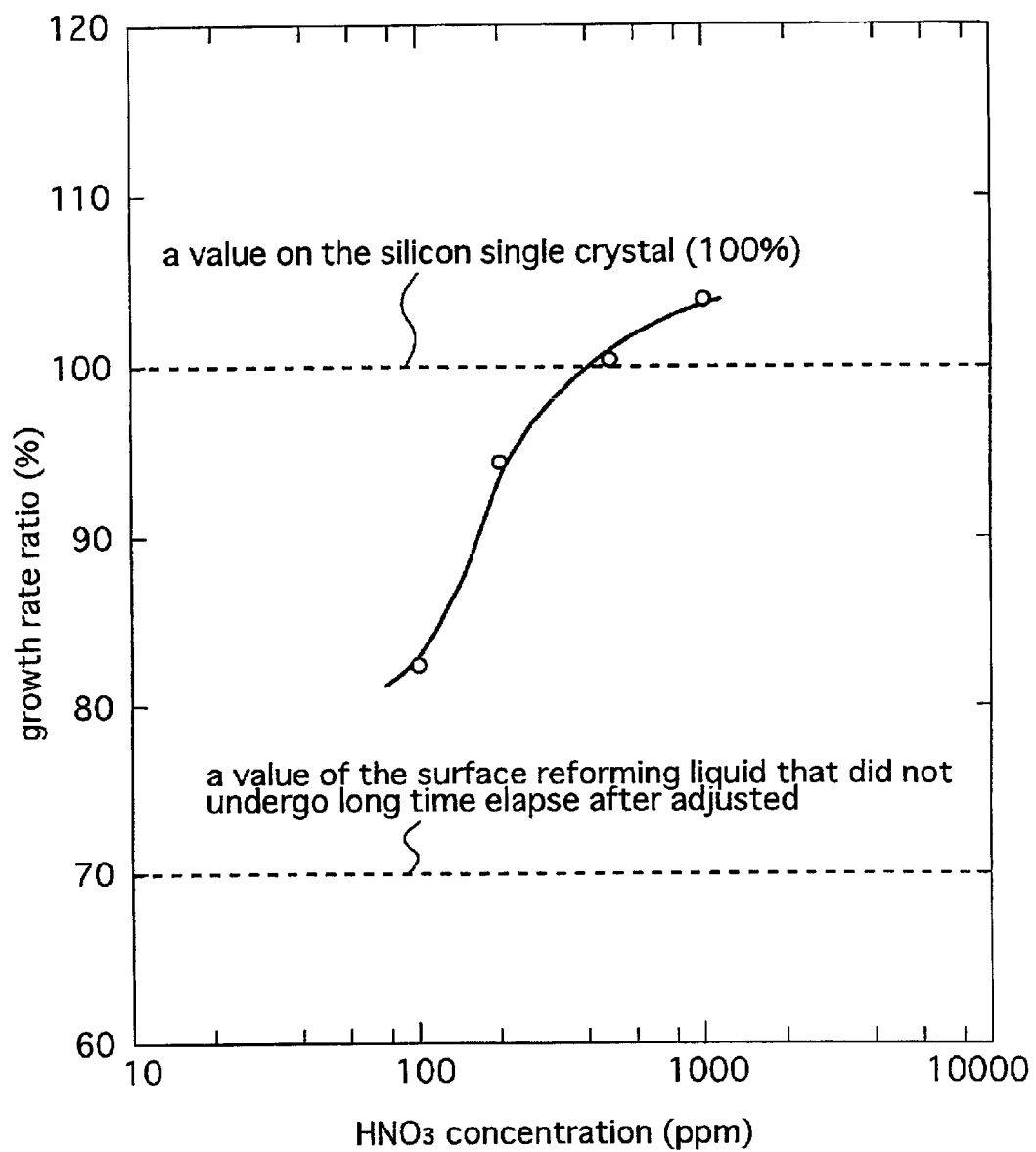
FIG. 12 is a graph showing a relationship between a concentration of the nitric acid and the growth rate ratio when the nitric acid is intended to be added into the surface reforming liquid when the underlying surface is the Silicon oxide film, in the second embodiment of the present invention.

The results are shown in FIG. 12. The abscissa denotes the concentration of the added nitric acid ($HNO_3$) on a logarithmic scale. In FIG. 12, for the sake of comparison, a value is also depicted which was obtained when the surface reforming process was performed by using the surface reforming liquid shortly after it was mixed. The surface reforming liquid had a volume ratio of 1:4:20 for the aqueous ammonia (30 wt %), the aqueous Hydrogen peroxide (30 wt %), and the pure water, and because it was used shortly after it was mixed contained few nitric acid based ions therein.

It can be understood from FIG. 12 that the addition of about 500PPM nitric acid permits the surface reforming liquid, which has a middle ammonia concentration such as a volume ratio 1:4:20 and was used shortly after it was mixed, to be effective for eliminating the surface dependency of the Silicon oxide film 12.

In this manner, the addition of the nitric acid into the surface reforming liquid makes it possible to remove the unstability of the reforming effect that is exhibited immediately after its preparation.

In addition, since the nitric acid is added, the nitric acid based ions ($NO_2^-$, $NO_3^-$) having a desired concentration can be produced in the surface reforming liquid by adjusting the concentration of the added nitric acid, even when the ammonia concentration in the surface reforming liquid is low. Accordingly, the range of the ammonia concentration in the surface reforming liquid can be remarkably extended. For example, the surface dependency of the Silicon oxide film 12 can be eliminated even by a surface reforming liquid that has an extremely low ammonia concentration, e.g., a surface reforming liquid whose volume ratio is 1:4:200 of the aqueous ammonia (30 wt %), the aqueous Hydrogen peroxide (30 wt %), and the pure water, respectively.

The following are preferable surface reforming conditions when the nitric acid is to be added.

the range of concentration of ammonia in the surface reforming liquid: 0.1 to 5.0% the range of concentration of nitric acid ($HNO_3$) in the surface reforming liquid: 500 to 2000 ppm the temperature of the surface reforming liquid: 60 to 80° C. the process time: 10 to 20 minutes When the surface reformation was performed in accordance with these conditions, the growth rate ratio became 103 to 108%.

As described above, in the second embodiment of the present invention, the surface reforming process is performed by the one-step process for the underlying layer which is either a Silicon nitride film or a Silicon oxide film. Being one-step process, the surface reforming,process is simplified compared to the first embodiment that requires two steps to execute the surface reformation

EXAMPLES

First Example

The first example will be explained with reference to FIG. 14. In this first example, the surface reforming method according to the first embodiment of the present invention was applied to a substrate 103 having a gate oxide film 22 was formed on a Silicon substrate 21, and gate wirings 23a, 23b made of polysilicon, for example, were formed on the film 22, and a Silicon nitride film 24 was then formed thereover.

Figure 14:
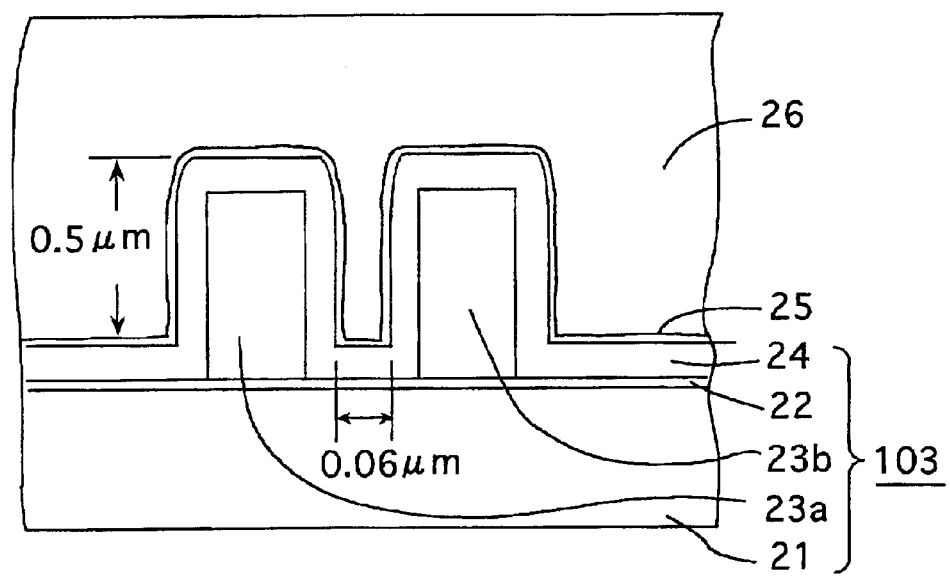
FIG. 14 is a sectional view showing the surface reforming method according to first example of the present invention.

As shown in FIG. 14, after the gate wirings 23a, 23b made of polysilicon were formed, the Silicon nitride film ($Si_3N_4$ film) of about 150 nm, which served as the underlying layer 24, was formed at 750° C. by the low pressure CVD method using a reaction gas consisting of dichlorsilane ($SiH_2Cl_2$) and ammonia ($NH_3$).

Then, the surface of the substrate 103 was etched by exposing it to the etching agent, and then was oxidized by exposing it to the oxidizing agent, whereby the surface reformation was carried out. As the surface reforming conditions, the ammonia aqueous solution was used as the etching agent, the concentration of the ammonia aqueous solution was varied in the range of 0.05 wt % to 1 wt %, the process temperature was set to 80° C., and the process time was set to 10 minutes. Then, after the rinse, the film-forming surface was oxidized by dipping it into the aqueous Hydrogen peroxide having a concentration of 4 wt % and a temperature at 80° C. As a result, a chemically stable thin layer 25 (underlying layer) made of the Silicon oxide was formed.

Then, a high $O_3$/TEOS CVD $SiO_2$ film 26 of 600 nm in thickness was formed on the surfaces of the reformed underlying layers 24, 25. As the film forming conditions for the high $O_3$/TEOS CVD $SiO_2$ film 26, the ozone concentration in $O_2$ was 8 mol %, i.e., the so-called high concentration, and the ozone, $O_2$, and TEOS constituted the $O_3$/TEOS reaction gas. The heating temperature of the substrate 103 was set to 450° C.

As shown in FIG. 14, after the surface reforming method of the present invention was applied to the surface which was uneven due to the presence of, e.g., the gate wirings 23a, 23b, etc., a high $O_3$/TEOS CVD $SiO_2$ film 26 was formed by the CVD method using the high $O_3$/TEOS film forming gas. Due to the surface reformation, the high $O_3$/TEOS CVD $SiO_2$ film 26 exhibited excellent recess filling and good step coverage.

Second Example

The second example will be explained with reference to FIG. 15A. In this second example, the first embodiment of the present invention was applied to a surface in which recesses having a narrow width and deep depth were present. For sake of comparison, a Comparative Example in which the film was formed without the surface reforming process is shown in FIG. 15B.

Figure 15A:
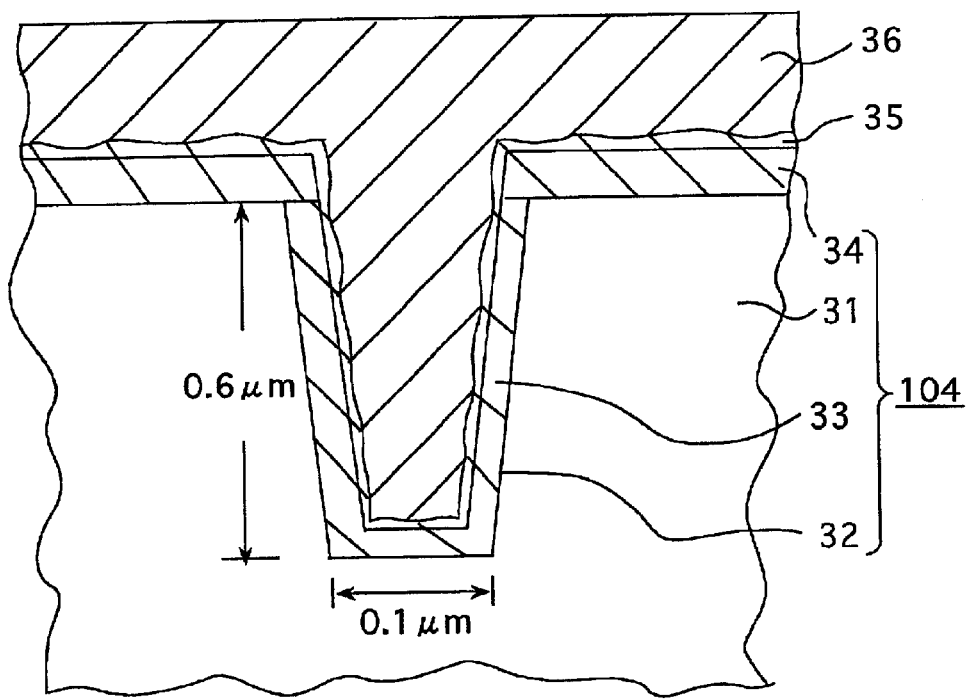
FIG. 15A is a sectional view showing the surface reforming method according to second example of the present invention.
Figure 15B:
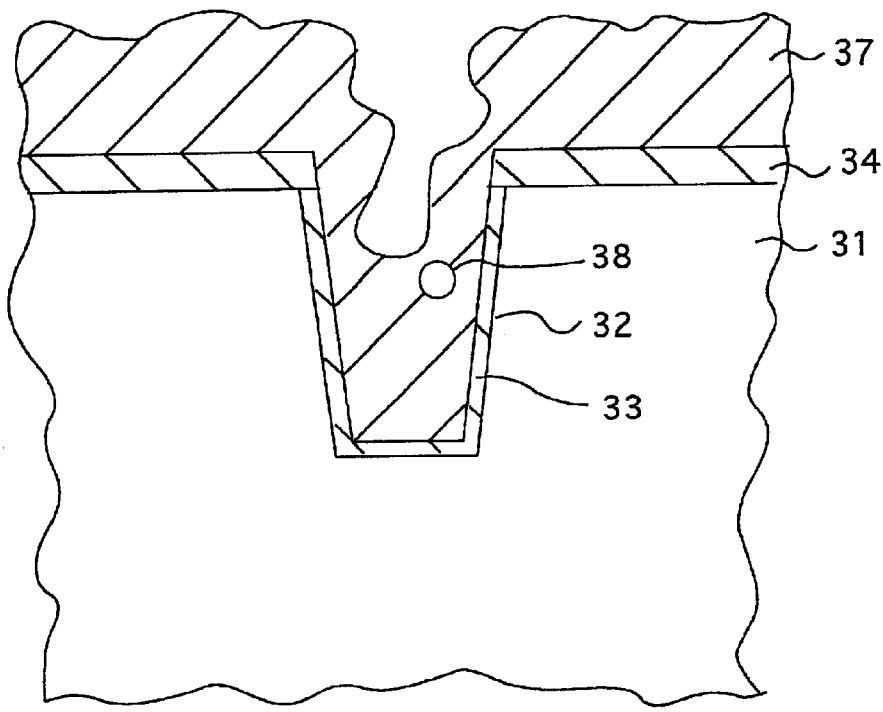
FIG. 15B is a sectional view showing a Comparative Example wherein the film is formed without the reforming process.
Figure 17A:
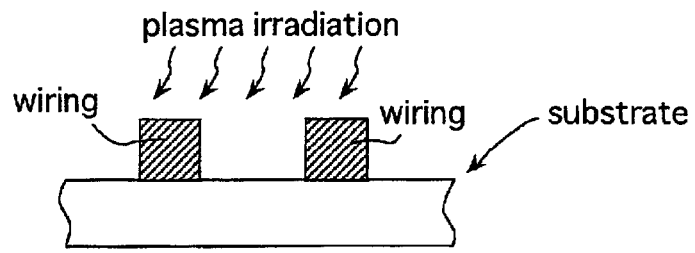
FIGS. 17A to 17D are sectional views showing the processes of reforming the film-forming surface in the prior art.
Figure 17B:
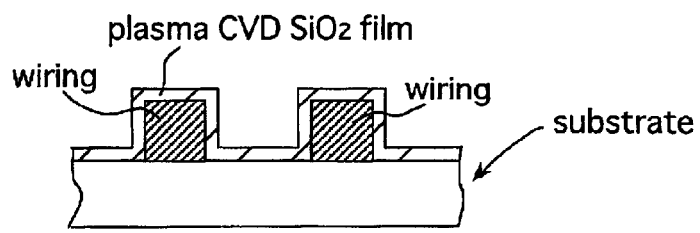
Figure 17C:
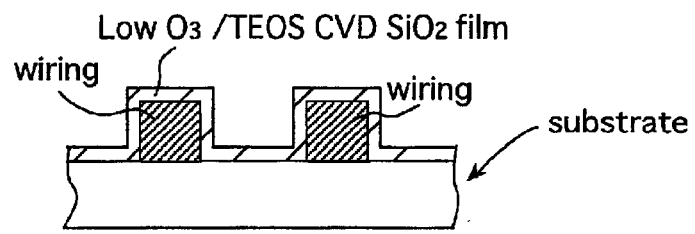
Figure 17D:
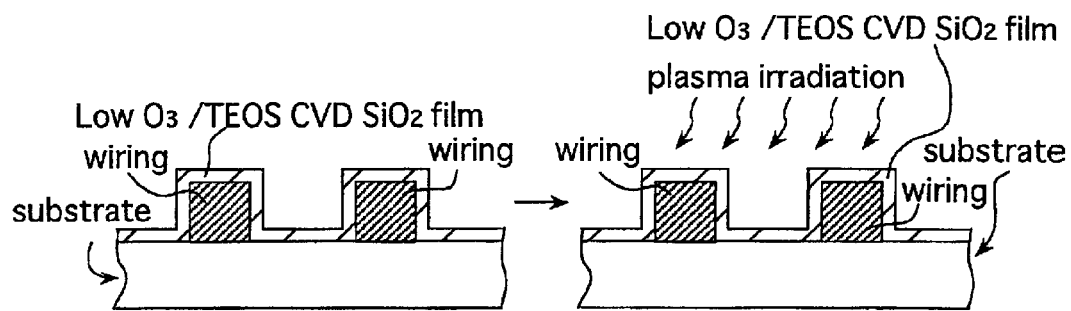

FIG. 15A is a sectional view showing structure when a high $O_3$/TEOS CVD $SiO_2$ film 36 was formed after the surface was reformed. FIG. 15B is a sectional view showing structure when a high $O_3$/TEOS CVD $SiO_2$ film 37 was formed without the surface reforming process. In FIG. 15B, the same symbols as those used in FIG. 15A designate the same elements as those in FIG. 15A.

As shown in FIG. 15A, a recess 32 that has a width of about 0.1 μm and a depth of about 0.6 μm was formed on a semiconductor substrate 31 made of Silicon, and then thermal oxide films 33, 34 of $SiO_2$ were formed as the underlying layer on a surface of the semiconductor substrate 31. These elements together constitute a substrate 104.

Then, the high $O_3$/TEOS CVD $SiO_2$ films 36, 37 were formed on a surface of the underlying layer, and the recess filling and the step coverage were examined.

As the reforming agent employed in the first step of the surface reforming process, unlike the first example, a mixed solution of aqueous ammonia and aqueous Hydrogen peroxide was employed. The mixed solution was heated to a temperature of 50 to 80° C., and the substrate 104 was dipped into this mixed solution for 10 minutes.

Then, in the oxidizing process of the second step, the temperature of the aqueous Hydrogen peroxide having a concentration of about 4 wt % was set to 80° C., and then the substrate 104 was dipped into it for 10 minutes. By this dipping, the Silicon oxide film (underlying layer) 35 was formed on surface layers of the thermal oxide films 33, 34.

In this example, as the film forming conditions for the high $O_3$/TEOS CVD $SiO_2$ films 36, 37, the ozone concentration and the heating temperature of the substrate 104 were set identically to the first example.

It can be understood from FIG. 15A that the high $O_3$/TEOS CVD $SiO_2$ film 36 having no voids and a planarized surface is formed on the sample to which the surface reforming method of the present invention is applied.

In contrast, as shown in FIG. 15B, it can be understood that, when the high $O_3$/TEOS CVD $SiO_2$ film 37 was formed without the surface reforming process, avoid 38 was generated, the surface of the film 37 was corrugated and a flat film cannot be obtained.

As described above, if the surface reformation for the underlying layers 33, 34 having very narrow concave regions such as the recess 32, etc., is performed by using the two-step process, i.e., etching process and then oxidizing, the recess filling and the step coverage of the high $O_3$/TEOS CVD $SiO_2$ film 36 for the recess 32 can be improved.

In the above embodiments, the high $O_3$/TEOS CVD $SiO_2$ film is employed as the insulating film formed on the film deposition surface. However, the present invention is not limited to this specific example, and an insulating film that is formed by using a combination of another Silicon-containing organic compound (e.g., siloxane such as hexamethyldisiloxane (HMDSO), etc., or alkoxysilane such as trimethoxysilane (TMS), etc.) and oxidizing gas (e.g., $O_2$, $O_3$, NO, $N_2O$, etc.) may be employed in the alternative.

Also, as the insulating film that is formed on the film deposition surface, in addition to the $SiO_2$ film that is very compatible with the film deposition surface, any one of a PSG (phosphosilicate glass) film, a BSG (borosilicate glass) film, or a BPSG (borophosphosilicate) film may be employed. As the film forming gas for forming the PSG film, a gas mixture of $O_3$, TEOS, and TMP (Trimethylphosphite: $P(OCH_3)_3$) or TMOP (Trimethylphosphate: $PO(OCH_3)_3$) may be employed. Also, as the film forming gas for forming the BSG film, a gas mixture of $O_3$, TEOS, and TMB (Trimethylborate:$B(OCH_3)_3$) may be employed. In addition, as the film forming gas for forming the BPSG film, a gas mixture of $O_3$, TEOS, TMB, and TMP or TMOP may be employed.

If the above reforming process is executed while applying ultrasonic wave energy or the megasonic wave energy to the substrates 102, 103, and 104, the reforming effect can be improved. The processing effect can also be improved by circulating the processing solution (e.g., etching agents, oxidizing agents, and $NH_3+H_2O_2+H_2O$ solution) using a pump (not shown) to direct the solution against the film deposition surface.

As described above, according to the present invention, the gas or the aqueous solution containing ammonia, hydrazine, amine, amino compound or their derivatives is brought into contact with the film deposition surface, and then the gas or the aqueous solution of Hydrogen peroxide, ozone, Oxy acid or their derivatives is brought into contact with the film deposition surface.

That is, the film deposition surface is firstly chemically activated by the etching, and secondly the surface is oxidized. Therefore, the surface can be oxidized at a low temperature close to room temperature, and thus the surface dependency can be easily eliminated.

Particularly, since the aqueous solution containing ammonia or hydrazine compound has a small surface tension and the gas of the reforming agent can be diffused into the narrow and deep recess, the surface dependency in such minute recess can be eliminated.

Accordingly, the interlayer or cover insulating film, which is formed using the thermal CVD method and is formed on the surface whose surface dependency is eliminated, exhibits no surface roughness or voids, exhibits no reduction in the film forming rate, and fills the narrow and deep recesses completely.

Also, if the film deposition surface is the surface of a Silicon nitride film, the surface dependency of the insulating film can be eliminated merely by exposing the surface to the aqueous Hydrogen peroxide.

In addition, if the film deposition surface is the surface of a Silicon oxide film, the surface dependency can be eliminated merely by exposing the surface to the aqueous solution containing any one of $NO_2^-$ and $NO_3^-$.

As a result, miniaturization and higher density can be achieved for the device.

What is claimed is:

1. A semiconductor device manufacturing method comprising the steps of:
    (a) contacting a surface of a Silicon oxide film with an aqueous solution containing any one of $NO_2^-$ and $NO_3^-$; and
    (b) forming an insulating film by CVD on the surface as obtained in step (a) after the film-forming surface is contacted with the aqueous solution.

2. A semiconductor device manufacturing method according to claim 1, wherein a mixed solution containing ammonia (NH), Hydrogen peroxide ($H_2O_2$), and water ($H_2O$) is employed as the aqueous solution.

3. A semiconductor device manufacturing method according to claim 1, wherein nitric acid ($HNO_3$) is added to the aqueous solution.

4. A semiconductor device manufacturing method according to claim 1, wherein the insulating film is a Silicon-containing insulating film which is formed by a thermal chemical vapor deposition employing a reaction gas that contains ozone and tetraethylorthosilicate.

5. A semiconductor device manufacturing method comprising the steps of:
    (a) bringing a gas or an aqueous solution containing an etchant selected from the group consisting of ammonia, hydrazine, amines, and amino compounds, into contact with a surface of a substrate, on which an insulating film is exposed, to chemically activate the surface;
    (b) subsequent to step (a), reforming the chemically activated surface as formed in step (a) by contacting the chemically activated surface with a gas or an aqueous solution containing an oxidizing agent selected from the group consisting of Hydrogen peroxide, ozone, Oxygen, nitric acid, and sulfuric acid, to form an oxide film on the chemically activated surface;
    (c) subsequent to step (b), forming an insulating film by CVD on the oxide film as formed in step (b).

6. A semiconductor device manufacturing method according to claim 5, wherein the surface brought into contact with the etchant has a silicon oxide film or a silicon nitride film exposed thereon.

7. A semiconductor device manufacturing method according to claim 6, wherein a semiconductor layer or a metal layer is additionally exposed on the surface brought into contact with the etchant.

8. A semiconductor device manufacturing method according to claim 5, wherein the etchant is an amine having a chemical formula $NR_nH_{3-n}$ (n=1,2,3, R: alkyl group).

9. A semiconductor device manufacturing method according to claim 5, wherein the insulating film is a Silicon-containing insulating film which is formed by a thermal chemical vapor deposition employing a reaction gas that contains ozone and tetraethylorthosilicate.

10. A semiconductor device manufacturing method comprising the steps of:
    (a) contacting a surface of a Silicon nitride film with an aqueous hydrogen peroxide solution to reform the surface; and then (b) forming an insulating film on the reformed surface as obtained in step (a).

11. A semiconductor device manufacturing method according to claim 10, wherein the insulating film is a Silicon-containing insulating film which is formed by a thermal chemical vapor deposition employing a reaction gas that contains ozone and tetraethylorthosilicate.

12. A semiconductor device manufacturing method comprising the steps of:
   (a) preparing a mixed solution containing ammonia ($NH_3$), Hydrogen peroxide ($H_2O_2$), and water ($H_2O$);
   (b) heating the mixed solution so that $NO_2^-$ and $NO_3^-$ are formed in the mixed solution;
   (c) contacting a surface of a Silicon oxide film with the mixed solution after the heating; and
   (d) subsequent to step (c), forming an insulating film by CVD on the surface as obtained in step (c).

13. A semiconductor device manufacturing method according to claim 12, wherein the insulating film is a Silicon-containing insulating film which is formed by a thermal chemical vapor deposition employing a reaction gas that contains ozone and tetraethylorthosilicate.

14. A semiconductor device manufacturing method consisting of the steps of:
   (a) bringing a gas or an aqueous solution containing an etchant selected from the group consisting of ammonia, hydrazine, amines, and amino compounds, into contact with a surface of a substrate, on which an insulating film is exposed, to chemically activate the surface;
   (b) subsequent to step (a), reforming the chemically activated surface as formed in step (a) by contacting the chemically activated surface with a gas or an aqueous solution containing an oxidizing agent selected from the group consisting of Hydrogen peroxide, ozone, Oxygen, nitric acid, and sulfuric acid, to form an oxide film on the chemically activated surface;
   (c) subsequent to step a (b), forming an insulating film by CVD on the oxide film as formed in step (b).

* * * * *

UNITED STATES PATENT AND TRADEMARK OFFICE
CERTIFICATE OF CORRECTION

PATENT NO. : 6,900,144 B2  
DATED : May 31, 2005  
INVENTOR(S) : Kazuo Maeda et al.

It is certified that error appears in the above-identified patent and that said Letters Patent is hereby corrected as shown below:

Column 16,
Line 21, "(NH)" should read -- $(NH_3)$ --.

Signed and Sealed this

Ninth Day of May, 2006

JON W. DUDAS  
*Director of the United States Patent and Trademark Office*